United States Patent
Adachi et al.

(10) Patent No.: US 9,373,809 B2
(45) Date of Patent: Jun. 21, 2016

(54) ELECTROLUMINESCENT DEVICE AND METHOD OF MANUFACTURING THEREOF

(75) Inventors: Hiroki Adachi, Tochigi (JP); Yohei Momma, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/479,896

(22) Filed: May 24, 2012

(65) Prior Publication Data

US 2012/0298973 A1   Nov. 29, 2012

(30) Foreign Application Priority Data

May 27, 2011   (JP) .................................. 2011-119296

(51) Int. Cl.
| | |
|---|---|
| H01L 51/50 | (2006.01) |
| H01L 51/52 | (2006.01) |
| H01L 51/56 | (2006.01) |
| H01L 51/00 | (2006.01) |

(52) U.S. Cl.
CPC ........ H01L 51/5212 (2013.01); H01L 51/0021 (2013.01); H01L 51/5228 (2013.01); *H01L 51/0022* (2013.01); *H01L 51/0023* (2013.01); *H01L 51/5012* (2013.01); *H01L 2251/5361* (2013.01)

(58) Field of Classification Search
CPC ............ H01L 51/0021; H01L 51/0022; H01L 51/0023; H01L 51/5012; H01L 51/5212; H01L 51/5228; H01L 2251/5361
USPC ................. 257/98, E33.061; 438/29
See application file for complete search history.

(56) References Cited

U.S. PATENT DOCUMENTS

| | | | |
|---|---|---|---|
| 4,644,264 A * | 2/1987 | Beha et al. ................... | 324/73.1 |
| 4,654,536 A | 3/1987 | Saito et al. | |
| 6,559,594 B2 | 5/2003 | Fukunaga et al. | |
| 6,593,691 B2 | 7/2003 | Nishi et al. | |
| 6,781,162 B2 | 8/2004 | Yamazaki et al. | |
| 6,909,111 B2 | 6/2005 | Yamagata et al. | |

(Continued)

FOREIGN PATENT DOCUMENTS

| | | |
|---|---|---|
| CN | 102136549 | 7/2011 |
| EP | 2 333 859 A1 | 6/2011 |

(Continued)

OTHER PUBLICATIONS

English machine translation of JP2009-283396 to Igarashi et al.*

(Continued)

*Primary Examiner* — Eduardo A Rodela
*Assistant Examiner* — Christopher M Roland
(74) *Attorney, Agent, or Firm* — Husch Blackwell LLP

(57) ABSTRACT

A highly reliable light-emitting device is provided. A light-emitting device in which problems due to a metal mask are prevented is provided. A light-emitting devi in which a problem due to the resistance of an upper electrode layer of a light-emitting element is prevented is provided. An electrode layer is provided over a substrate in advance, and an EL layer and an upper electrode layer are formed in the same pattern without use of a metal mask so as to overlap with the electrode layer. After that, the electrode layer is electrically connected to the upper electrode layer. As a connection method, a laser light irradiation method, a method in which physical pressure is applied, a method in which heating is performed under the state where physical pressure is applied, or the like is used.

17 Claims, 14 Drawing Sheets

(56) References Cited

U.S. PATENT DOCUMENTS

| | | |
|---|---|---|
| 7,161,184 B2 | 1/2007 | Miyagi et al. |
| 7,663,306 B2 | 2/2010 | Imamura |
| 7,834,543 B2 | 11/2010 | Takata |
| 7,871,930 B2 | 1/2011 | Yamagata et al. |
| 7,943,938 B2 | 5/2011 | Miyagi et al. |
| 7,999,463 B2 | 8/2011 | Nomura |
| 8,153,511 B2 | 4/2012 | Yamada et al. |
| 2002/0142697 A1 | 10/2002 | Yamagata et al. |
| 2003/0011304 A1* | 1/2003 | Duineveld et al. ............ 313/506 |
| 2003/0060055 A1 | 3/2003 | Kamijima |
| 2003/0227253 A1* | 12/2003 | Seo et al. ....................... 313/504 |
| 2004/0119403 A1* | 6/2004 | McCormick et al. ......... 313/506 |
| 2005/0100660 A1* | 5/2005 | Ito et al. .......................... 427/66 |
| 2005/0176178 A1* | 8/2005 | Takahashi ..................... 438/123 |
| 2008/0186572 A1* | 8/2008 | Tomikawa et al. ............ 359/462 |
| 2009/0098710 A1* | 4/2009 | Yamazaki ..................... 438/458 |
| 2010/0233931 A1 | 9/2010 | Yamagata et al. |
| 2011/0089814 A1 | 4/2011 | Nomura |
| 2011/0089823 A1 | 4/2011 | Nomura |
| 2011/0101388 A1 | 5/2011 | Nomura |
| 2011/0136266 A1 | 6/2011 | Yamagata et al. |
| 2011/0140617 A1 | 6/2011 | Nomura |
| 2011/0210335 A1 | 9/2011 | Miyagi et al. |
| 2011/0210661 A1 | 9/2011 | Nishi et al. |
| 2012/0228592 A1 | 9/2012 | Yokoyama et al. |
| 2012/0248489 A1 | 10/2012 | Yoshizumi et al. |

FOREIGN PATENT DOCUMENTS

| | | |
|---|---|---|
| EP | 2 355 199 A1 | 8/2011 |
| JP | 5-299177 | 11/1993 |
| JP | 11-97183 | 4/1999 |
| JP | 2002-260857 | 9/2002 |
| JP | 2005-235491 A | 9/2005 |
| JP | 2006-201421 A | 8/2006 |
| JP | 2006-323032 | 11/2006 |
| JP | 2009-130132 | 6/2009 |
| JP | 2009-283396 | 12/2009 |
| JP | 4664604 B2 | 4/2011 |
| JP | 2011-90925 | 5/2011 |
| JP | 2011-124231 | 6/2011 |
| KR | 10-2011-0063372 | 6/2011 |

OTHER PUBLICATIONS

English machine translation of JP2002-260857 to Yamagata et al.*
International Search Report for WO application PCT/JP2012/064337, mailing date Aug. 28, 2012.
Written Opinion of the International Searching Authority for WO application PCT/JP2012/064337, mailing date Aug. 28, 2012.

* cited by examiner 101 133   111 109 105 107 103

ELECTROLUMINESCENT DEVICE AND METHOD OF MANUFACTURING THEREOF

TECHNICAL FIELD

The present invention relates to a method of manufacturing a light-emitting device to which an organic EL element is applied. Further, the present invention relates to a light-emitting device to which an organic EL element is applied.

BACKGROUND ART

Organic EL elements have been actively researched and developed. In the fundamental structure of an organic EL element, a layer containing a light-emitting organic compound is interposed between a pair of electrodes. By applying voltage to this element, light emission from the light-emitting organic compound can be obtained.

The organic EL element can be formed into a film shape; thus, a large-area element can easily be formed. Therefore, the organic EL element has a high utility value as a surface light source that can be applied to lighting or the like.

For example, a lighting device using an organic EL element is disclosed in Patent Document 1.

In addition, as for an organic EL element, there are a top-emission type in which light is extracted from the side of a substrate, on which an organic EL element is formed; a bottom-emission type in which light is extracted from the side of the substrate, which is opposite to the side on which the organic EL element is formed; and a dual-emission type in which light is extracted from both the sides.

REFERENCE

Patent Document

[Patent Document 1] Japanese Published Patent Application No. 2009-130132

DISCLOSURE OF INVENTION

In the case where an organic EL element (hereinafter also referred to as an EL element or a light-emitting element) is applied to a lighting device, a voltage drop due to the resistance of an upper electrode layer or a lower electrode layer included in the light-emitting element tends to be significant as the area of a light-emitting portion increases. When the voltage drop is significant, there arises a problem in that luminance gradient might be seen. In order to prevent such a problem, the upper electrode layer or the lower electrode layer needs to be provided with an electrode layer as an auxiliary (hereinafter also referred to as an auxiliary electrode layer) which is formed using a material having low resistivity.

In particular, a light-transmitting conductive material which is used for a transparent electrode on the light extraction side has relatively high resistance; therefore, an auxiliary electrode layer needs to be provided. However, particularly in the case of a top-emission type (including a dual-emission type) in which light emission is obtained from the substrate surface side, a pattern of the auxiliary electrode layer needs to be formed after formation of the light-emitting element; accordingly, the light-emitting element might be damaged. For example, in the case where a conductive film which is to be the auxiliary electrode layer is formed by a sputtering method, thermal or physical damage to the light-emitting element is concerned. Further, when the conductive film is processed by a photolithography method or the like, there arise problems of optical or thermal damage to the light-emitting element, dissolution of the light-emitting element with an organic solvent, for example, at the time of removal of a resist, and the like.

Meanwhile, as for formation of a light-emitting element, as an example of a method of stacking a layer containing a light-emitting organic compound and an upper electrode layer in this order over a lower electrode layer formed over a substrate having an insulating surface, a vacuum evaporation method is given. As a method of forming an island-shaped layer by a vacuum evaporation method, a method using a metal mask (also referred to as a shadow mask), which is a metal plate provided with an opening, is known. The metal mask is provided between a substrate and an evaporation source to be in contact with the substrate, and evaporation is performed on the substrate through the opening in the metal mask, whereby an island-shaped pattern according to the shape of the opening can be formed. Note that as the distance between the metal mask and the substrate is shorter, it is possible to form an island-shaped layer with a clearer shape based on the opening, in other words, a shape whose periphery is less obscure.

On the other hand, the probability of the occurrence of problems becomes high when the metal mask is used in contact with the substrate. For example, a substrate surface is damaged by an edge of the opening in the metal mask in some cases. Specifically, at the time of placing the metal mask in contact with the substrate, the metal mask might scratch the substrate surface, thereby breaking another layer which has already been formed over the substrate. In particular, overlap between the opening edge of the metal mask and a region near a light-emitting region might short-circuit the light-emitting element. Further, dust attached to the metal mask (including a small foreign substance referred to as a particle) is transferred from the metal mask to the substrate in some cases.

In addition, use of a large metal mask for a large substrate might cause a problem in that a pattern is displaced owing to a bend or the like of a metal plate used as the metal mask. If the thickness of the metal plate is increased to prevent this problem, there arises a problem in that a peripheral portion of an island-shaped pattern is shaded by the metal plate and the pattern becomes obscure (a region in which the layer containing a light-emitting organic compound is thin is formed) or a problem in that the weight of the metal mask itself is significantly increased, resulting in difficulty in handling.

The present invention is made in view of the foregoing technical background. Thus, an object of one embodiment of the present invention is to provide a highly reliable light-emitting device. More specifically, an object is to provide a light-emitting device in which problems due to a metal mask are prevented. Another object is to provide a light-emitting device in which a problem due to the resistance of an upper electrode layer of a light-emitting element is prevented.

One embodiment of the present invention achieves at least one of the above objects.

In order to achieve at least one of the above objects, a method of manufacturing a light-emitting device is employed by which an EL layer and an upper electrode layer that are included in a light-emitting element can be formed in the same pattern without use of a metal mask. Further, a step of limning an electrode layer (also referred to as a connection electrode layer) to be electrically connected to the upper electrode layer is performed before the step of forming the EL layer and the upper electrode layer. However, since the EL layer having high resistance is located between the upper electrode layer and the connection electrode layer, it is difficult to obtain electrical connection therebetween by simply using such a method.

In view of the foregoing problems, one embodiment of the present invention employs the following method: a connection electrode layer is provided in advance over a substrate having an insulating surface, an EL layer and an upper electrode layer are formed in the same pattern so as to overlap with the connection electrode layer, and then the connection electrode layer is electrically connected to the upper electrode layer. As a method of electrically connecting the connection electrode layer to the upper electrode layer, for example, a laser light irradiation method, a method in which physical pressure is applied, or a method in which heating is performed under the state where physical pressure is applied is used.

When such a connection electrode layer is formed so as to be insulated from a lower electrode layer included in the light-emitting element, the connection electrode layer can be used as an auxiliary electrode layer for supporting the conductivity of the upper electrode layer of the light-emitting element. Moreover, when the connection electrode layer is provided so as to be electrically connected to a wiring (e.g., a wiring for supplying external power) provided over the substrate, the upper electrode layer included in the light-emitting element and the wiring can be electrically connected to each other through the connection electrode layer. That is, according to the method of manufacturing a light-emitting device of one embodiment of the present invention, the auxiliary electrode layer which is electrically connected to the upper electrode layer and supports the conductivity thereof, and the connection electrode layer which is electrically connected to the wiring provided over the substrate can be formed in the same step.

In other words, one embodiment of the present invention is a method of manufacturing a light-emitting device including the steps of forming a connection electrode layer over an insulating surface, forming a layer containing a light-emitting organic compound over the connection electrode layer, forming a second electrode layer over the layer containing a light-emitting organic compound, and electrically connecting the connection electrode layer to the second electrode layer.

In this manner, the layer containing a light-emitting organic compound (also referred to as an EL layer) and the second electrode layer (also referred to as an upper electrode layer) are formed so as to cover the connection electrode layer, and then the upper electrode layer and the connection electrode layer are electrically connected to each other; thus, the connection electrode layer can be surely electrically connected to the upper electrode layer even when the EL layer and the upper electrode layer are formed in the same pattern without use of a metal mask. Accordingly, a light-emitting device in which problems due to a metal mask are prevented can be manufactured.

Another embodiment of the present invention is a method of manufacturing a light-emitting device including the steps of forming a first electrode layer over an insulating surface, forming a connection electrode layer over the insulating surface so as to be electrically insulated from the first electrode layer, forming a layer containing a light-emitting organic compound over the first electrode layer and the connection electrode layer, forming a second electrode layer over the layer containing a light-emitting organic compound, and electrically connecting the connection electrode layer to the second electrode layer.

The connection electrode layer is formed so as to be electrically insulated from the first electrode layer (hereinafter also referred to as a lower electrode layer), whereby the connection electrode layer can be used as an auxiliary electrode layer for supporting the conductivity of the upper electrode layer. Accordingly, a light-emitting device in which problems due to a metal mask and a problem due to the resistance of an upper electrode layer of a light-emitting element are prevented can be manufactured.

In the method of manufacturing a light-emitting device, the connection electrode layer may be electrically connected to the second electrode layer by irradiating a region in which the connection electrode layer and the second electrode layer overlap with each other with laser light.

The laser light irradiation can facilitate sure electrical connection between the upper electrode layer and the connection electrode layer.

In the method of manufacturing a light-emitting device, the laser light can be delivered through a light-transmitting substrate provided to face the insulating surface.

The laser light irradiation can be performed after the light-emitting element is sealed with a counter substrate. Therefore, the irradiation step with laser light can be performed in the air, and thus the structure of an apparatus for laser irradiation can be simplified. In addition, the light-emitting element is not exposed to the air even when the laser irradiation is performed in the air. Accordingly, a highly reliable light-emitting device can be manufactured.

Any of the above methods of manufacturing a light-emitting device may include, after the connection electrode layer is electrically connected to the second electrode layer, the steps of detecting a portion with a light-emission defect by applying voltage between the first electrode layer and the second electrode layer, and insulating the portion with a light-emission defect by irradiating the portion with a light-emission defect with laser light.

In this manner, a portion with a light-emission defect is detected and laser light irradiation is performed, whereby the portion with a light-emission defect can be insulated in the manufacturing process. Accordingly, a highly reliable light-emitting device in which light-emission defects are reduced can be manufactured.

Another embodiment of the present invention is a light-emitting device including a first electrode layer and a connection electrode layer over an insulating surface, a layer containing a light-emitting organic compound over the first electrode layer and the connection electrode layer, and a second electrode layer over the layer containing a light-emitting organic compound. In the light-emitting device, the connection electrode layer is electrically connected to the second electrode layer in a region that is over the connection electrode layer and is irradiated with laser light.

The connection electrode layer which is thus electrically connected to the upper electrode layer in the region irradiated with laser light can be used as a connection electrode layer connected to a wiring provided over a substrate having an insulating surface or as an auxiliary electrode layer for supporting the conductivity of the upper electrode layer. Accordingly, a problem due to the resistance of the upper electrode layer of a light-emitting element can be prevented in the light-emitting device.

In the region irradiated with laser light, a connection portion where the upper electrode layer and the connection electrode layer are welded together, form an alloy, or are physically in contact with each other is formed, so that the upper electrode layer and the connection electrode layer are electrically connected to each other through the connection portion.

In addition, an optical property of a region irradiated with laser light is sometimes different from that of a region not irradiated with laser light. One or both of the upper electrode layer and the EL layer are vaporized, reduced in thickness, or modified by laser light irradiation, which causes a change in an optical property such as light reflectance or light transmittance. Such a region whose optical property is changed by laser light irradiation can be detected by observation with an optical microscope, for example.

In the light-emitting device, the second electrode layer may have a light-transmitting property with respect to light emitted from the layer containing a light-emitting organic compound.

In the light-emitting device, the first electrode layer and the second electrode layer may each have a light-transmitting property with respect to light emitted from the layer containing a light-emitting organic compound.

In particular, since such a light-transmitting material has low conductivity, it is particularly effective to use the above connection electrode layer as an auxiliary electrode layer. By forming a light-transmitting layer only as the upper electrode layer of the upper and lower electrode layers, a top-emission light-emitting device can be obtained; by forming light-transmitting layers as both the upper electrode layer and the lower electrode layer, a dual-emission light-emitting device can be obtained. Each of the light-emitting devices can be a highly reliable light-emitting device in which a problem due to the resistance of the upper electrode layer is relieved.

Note that in this specification and the like, a metal mask is a mask including openings for forming a plurality of island-shaped patterns in one light-emitting device. Thus, the metal mask does not include a blocking mask for providing a non-film formation region in a region (e.g., a region overlapping with a region provided with a sealing material) sufficiently apart from a light-emitting region of a light-emitting device, or in a region between adjacent light-emitting devices. Note that the blocking mask may include an opening edge which overlaps with a wiring connected to the light-emitting device, depending on a layout of the wiring.

Note that in this specification, an EL layer refers to a layer provided between a pair of electrodes of a light-emitting element, and specifically refers to at least a layer containing a light-emitting organic compound or a stack including a layer containing a light-emitting organic compound.

According to one embodiment of the present invention, a method of manufacturing a highly reliable light-emitting device can be provided. More specifically, a method of manufacturing a light-emitting device in which problems due to a metal mask are prevented can be provided. Further, a method of manufacturing a light-emitting device in which a problem due to the resistance of an upper electrode layer of a light-emitting element is prevented can be provided. Further, a highly reliable light-emitting device can be provided.

BEST MODE FOR CARRYING OUT THE INVENTION

Figure 1A:
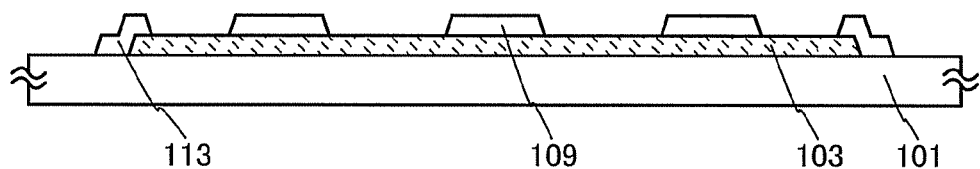
FIGS. 1A to 1D illustrate a method of manufacturing a light-emitting device according to one embodiment of the present invention.

Embodiments and an example will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments and example. Note that in the structures of the invention described below, the same portions or portions having similar functions are denoted by the same reference numerals in different drawings, and description of such portions is not repeated.

Note that in each drawing described in this specification, the size, layer thickness, or region of each component is exaggerated for clarity in some cases. Therefore, embodiments of the present invention are not limited to such scales.

Embodiment 1

In this embodiment, an example of a method of manufacturing a light-emitting device according to one embodiment of the present invention will be described with reference to FIGS. 1A to 1D, FIGS. 2A to 2D, FIGS. 3A and 3B, FIG. 4, and FIG. 5.

<Example of Manufacturing Method>

First, a substrate 101 is prepared. A lower electrode layer 103, an insulating layer 109, and an insulating layer 113 are formed over the substrate 101 (see FIG. 1A).

The lower electrode layer 103 can be formed in such a manner that a conductive film is formed by a film formation method such as a sputtering method, and then an unnecessary portion is removed by a patterning method such as a photolithography method.

The insulating layer 109 is provided for electrically insulating a connection electrode layer 111 formed later from the lower electrode layer 103. The insulating layer 109 can be formed by a sputtering method, a CVD method, a printing method (including a screen printing method and an offset printing method), or an inkjet method, for example.

The insulating layer 113 covers an end portion of the lower electrode layer 103 and is provided to prevent the lower electrode layer 103 and an upper electrode layer 107 formed later from being short-circuited at the end portion. The insulating layer 113 can be formed by a method similar to that for the insulating layer 109. In addition, the insulating layer 109 and the insulating layer 113 may be formed at the same time with the use of the same material or may be formed in different steps with the use of different materials. In addition, the insulating layer 113 is not necessarily provided unless needed.

Each of the insulating layer 109 and the insulating layer 113 preferably has a shape in which the thickness is smaller toward an end portion, that is, a tapered shape. In particular, if an EL layer 105 formed later is divided or thinned owing to a height difference at the end portion of the insulating layer 109 or the end portion of the insulating layer 113, a short circuit between the upper electrode layer 107 and the lower electrode layer 103 might occur. Accordingly, it is preferable that the height difference gradually decrease toward the end portion.

Figure 1B:
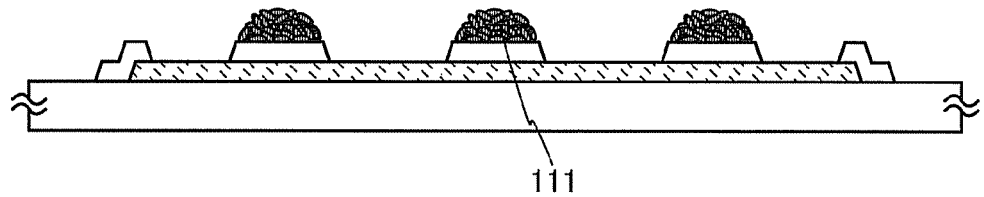

Next, the connection electrode layer 111 is formed over the insulating layer 109 (see FIG. 1B). The connection electrode layer 111 is to be electrically connected to the upper electrode layer 107 formed later, thereby functioning as an auxiliary electrode layer for supporting the conductivity of the upper electrode layer 107. Therefore, the connection electrode layer 111 is preferably formed using a material having higher conductivity than a conductive material for the upper electrode layer 107. The connection electrode layer 111 can be formed by a sputtering method or a printing method, for example.

Further, the connection electrode layer 111 preferably has a surface with an uneven shape. It is preferable that the height difference between a depression and a projection of the uneven shape be substantially the same as or greater than the thickness of the EL layer 105 to be formed thereover. Here, the height difference between a depression and a projection of the uneven shape means the largest difference on the whole surface, between the highest portion of a projection and the lowest portion of a depression that is adjacent to the projection.

When the surface of the connection electrode layer 111 has such a large height difference, a region in which the EL layer 105 formed over the connection electrode layer 111 is physically divided can be easily formed, and a region in which the upper electrode layer 107 formed over the EL layer 105 is physically in contact with the connection electrode layer 111 can be formed. Further, the surface area of the connection electrode layer 111 can be increased, so that the area of contact between the connection electrode layer 111 and the upper electrode layer 107, which is obtained by connection treatment performed later, can be increased. Consequently, the contact resistance therebetween can be effectively reduced. The electrical connection to the upper electrode layer 107 is preferably obtained by fusing part of the surface of the connection electrode layer 111 through the connection treatment performed later, because such a method can facilitate efficient fusion of the projection on the surface.

The connection electrode layer 111 having such an uneven surface is preferably formed by a printing method such as a screen printing method. A conductive paste used in a printing method contains conductive particles, an organic resin, and an organic solvent, and a conductive structure is formed as follows: the organic solvent is vaporized while part of the organic resin is decomposed, and the conductive particles are welded together, by heat treatment. The formed structure may be porous and have an uneven surface with a large height difference, depending on a material of the organic resin or a particle diameter of the conductive particle which are included in the conductive paste. By being formed by a printing method such as a screen printing method in this manner, the connection electrode layer 111 can have an uneven surface with a large height difference.

The following method can be given as a method of forming the connection electrode layer 111, which is a method other than the printing method. A conductive film is formed by a film formation method such as a sputtering method or an evaporation method, and then an, unnecessary portion of the film is etched to form a pattern of the connection electrode layer 111 over the insulating layer 109. After that, a resist is formed in a slit pattern, a lattice pattern, or a dot pattern over a surface of the connection electrode layer 111 and the conductive film is subjected to half etching such that the conductive film is not eliminated; thus, an uneven shape can be formed on, the surface of the connection electrode layer 111. Alternatively, plasma treatment, blasting treatment, reverse sputtering treatment, or the like may be performed on the surface of the connection electrode layer 111 to form an uneven shape.

In the drawings used in this specification, the thicknesses of the EL layer 105 and the upper electrode layer 107 are exaggerated for clarity.

Figure 1C:
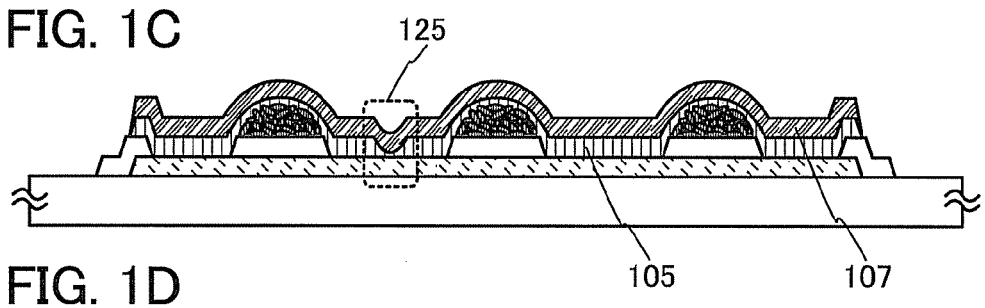

Then, the EL layer 105 and the upper electrode layer 107 are formed over an exposed portion of the lower electrode layer 103 and the connection electrode layer 111 (see FIG. 1C).

The EL layer 105 includes at least a layer containing a light-emitting organic compound (also referred to as a light-emitting layer), and the EL layer 105 can be formed by a vacuum evaporation method, for example. In the case of being formed by a vacuum evaporation method, the EL layer 105 is preferably formed using a blocking mask such that the EL layer 105 is not formed in a non-film formation region (a region which is sufficiently apart from a light-emitting region, such as an outer peripheral portion of the substrate 101 or a region overlapping with a region provided with a sealing material 123). Such a blocking mask has an opening edge in a region which is sufficiently apart from the light-emitting region. A structure that can be used for the EL layer 105 will be described in Embodiment 5. Note that the EL layer 105 can be formed by a droplet discharge method such as an inkjet method, a coating method, or the like instead of a vacuum evaporation method.

Here, in the formation of the EL layer 105, a region in which the EL layer 105 is not formed locally or is locally thin might be formed. For example, such a region can be formed by attachment of a foreign substance to the substrate 101, which has been attached to an inner wall of a vacuum evaporation apparatus for the film formation or the blocking mask for the film formation. In the case where a plurality of films is successively formed as the EL layer 105, if such a foreign substance is moved or eliminated during the film formation, a region in which the EL layer 105 is locally thin is formed. Such a region in which the EL layer 105 is thin has lower electric resistance in the thickness direction than the other region; therefore, when voltage is applied between the upper electrode layer and the lower electrode layer of the light-emitting element, current is concentrated on the region and a luminescent spot where emission intensity is high is observed as a defect in many cases. Furthermore, in the region in which the EL layer 105 is thin, more current flows than in the other region and thus a short-circuit defect might be caused. Note that such a foreign substance might remain over the lower electrode layer 103.

In this embodiment, the case where such a region (a region 125) in which the EL layer 105 is locally thin is formed will be described.

Next, the upper electrode layer 107 is formed over the EL layer 105. The upper electrode layer 107 can be obtained by forming a conductive film by a film formation method such as a sputtering method or a vacuum evaporation method. Further, the upper electrode layer 107 can be formed using the same blocking mask that is used in the formation of the EL layer 105. The use of the same blocking mask is preferable because the blocking mask can be shared, leading to prevention of a problem that can be caused when the blocking mask is replaced with another.

Here, when the surface of the connection electrode layer 111 has an uneven shape, the EL layer 105 is divided owing to a height difference because the thickness of the EL layer 105 is sufficiently small compared to the height difference of the uneven shape, so that a region in which part of the surface of the connection electrode layer 111 is exposed is formed. The upper electrode layer 107 formed thereover is in contact with the part of the surface of the connection electrode layer 111, so that a region in which the connection electrode layer 111 is electrically connected to the upper electrode layer 107 is formed.

At this stage, a light-emitting element in which the lower electrode layer 103, the EL layer 105, and the upper electrode layer 107 are stacked is formed over the substrate 101.

Figure 1D:
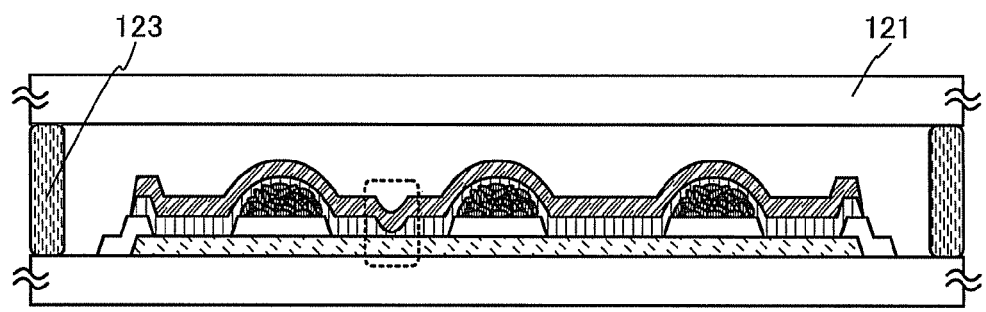

Then, the substrate 101 and a counter substrate 121 are bonded to each other with the sealing material 123 (see FIG. 1D). In this embodiment, a thermosetting material is used as the sealing material 123. First, the sealing material 123 is formed in an outer peripheral portion of the substrate 101 or the counter substrate 121. The substrate 101 and the counter substrate 121 are bonded to each other, and then are subjected to vacuum pressure bonding while being heated under reduced pressure. Through these steps, the sealing material 123 is thermally cured; thus, the substrate 101 is bonded to the counter substrate 121. The sealing material 123 can be formed by a printing method such as screen printing, an inkjet method, a dispenser method, or the like.

Figure 2A:
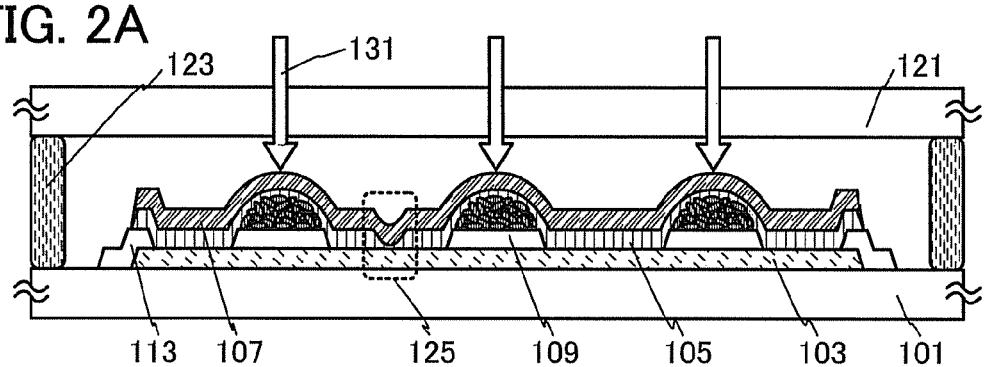
FIGS. 2A to 2D illustrate a method of manufacturing a light-emitting device according to one embodiment of the present invention.

Next, a region in which the upper electrode layer 107 and the connection electrode layer 111 overlap with each other is irradiated with laser light 131 through the counter substrate 121, so that the upper electrode layer 107 and the connection electrode layer 111 are surely electrically connected to each other (see FIG. 2A).

As the laser light 131, light, part of which has a wavelength at which the light passes through at least the counter substrate 121 is used. Further, as the laser light 131, light having a wavelength at which the light is absorbed by at least one of the connection electrode layer 111, the upper electrode layer 107, and the EL layer 105 is used. The laser light 131 preferably has an intensity that is low enough not to cause the connection electrode layer 111, the upper electrode layer 107, and the EL layer 105 to be eliminated.

Figure 2B:
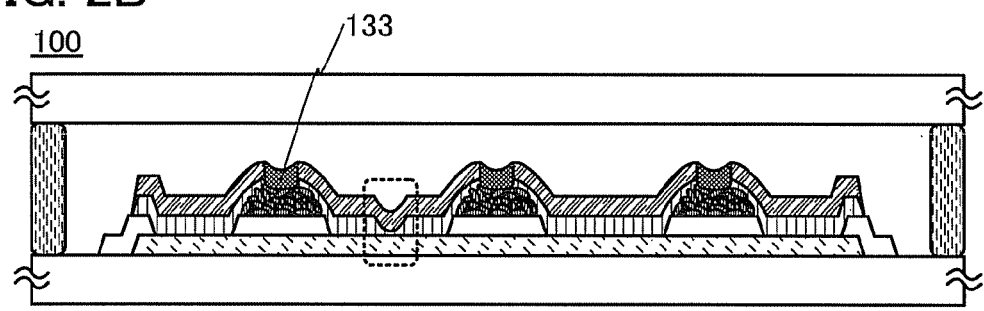
Figure 2C:
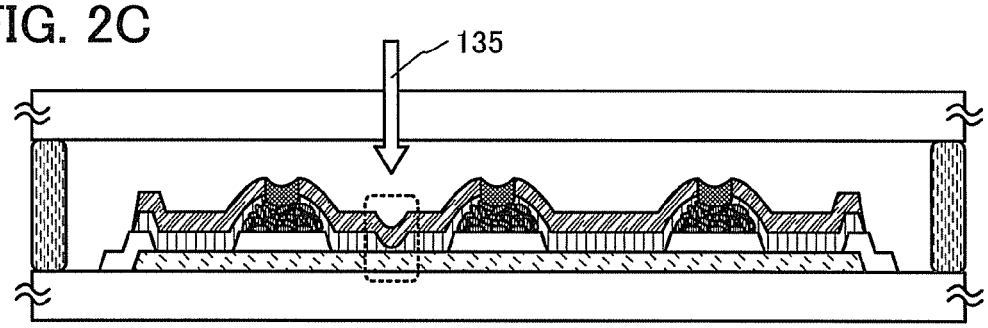

By irradiation with the laser light 131, a connection portion 133 is formed in contact with the surface of the connection electrode layer 111; thus, the connection electrode layer 111 is electrically connected to the upper electrode layer 107 through the connection portion 133 (see FIG. 2B).

Here, in the region irradiated with the laser light 131, the connection portion 133 that electrically connects the connection electrode layer 111 to the upper electrode layer 107 is preferably formed in the following manner, for example: part of the connection electrode layer 111 and part of the upper electrode layer 107 are fused to be welded together or form an alloy. When part of the connection electrode layer 111 and part of the upper electrode layer 107 are welded together or, preferably, form an alloy, contact resistance can be reduced and mechanical strength can be increased. Note that it is not always necessary that the connection electrode layer 111 and the upper electrode layer 107 are welded together or form an alloy; for example, the EL layer 105 may be melted or partly eliminated by heat, in which case the surface of the connection electrode layer 111 and the upper electrode layer 107 are physically in contact with each other to be electrically connected. In addition, even in the case where the laser light 131 has such a high intensity as to cause elimination (also referred to as ablation) of the EL layer 105 together with the upper electrode layer 107, the connection electrode layer 111 and the upper electrode layer 107 might be in contact with each other, be welded together, or form an alloy to be electrically connected in the vicinity of the outer periphery of the region irradiated with the laser light 131, which is close to a non-irradiation region.

For clarity, in drawings used below, the connection portion 133 is formed over the connection electrode layer 111 so as to be in contact with the connection electrode layer 111 and the upper electrode layer 107 as in FIG. 2B. As described above, the connection portion 133 can be a portion where the connection electrode layer 111 and the upper electrode layer 107 are welded together, a region in which an alloy thereof is formed, or a physical contact portion thereof, and the upper electrode layer 107 and the connection electrode layer 111 are electrically connected to each other through the connection portion 133.

Figure 4:
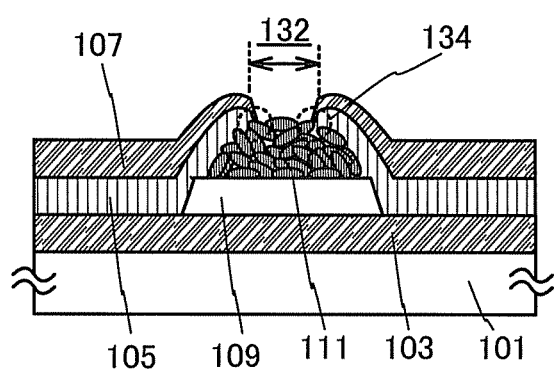
FIG. 4 illustrates a method of manufacturing a light-emitting device according to one embodiment of the present invention.

Here, FIG. 4 illustrates a structure example of a connection portion in the case where ablation of the EL layer 105 and the upper electrode layer 107 over the connection electrode layer 111 is caused by irradiation with the laser light 131. In a laser irradiation region 132 in FIG. 4, the EL layer 105 and the upper electrode layer 107 over the connection electrode layer 111 are eliminated. Here, in a region which is part of an outer peripheral portion of the laser irradiation region 132, a connection portion 134 where the upper electrode layer 107 and the connection electrode layer 111 are physically in contact with each other is formed. The connection portion 134 electrically connects the upper electrode layer 107 to the connection electrode layer 111.

Figure 3A:
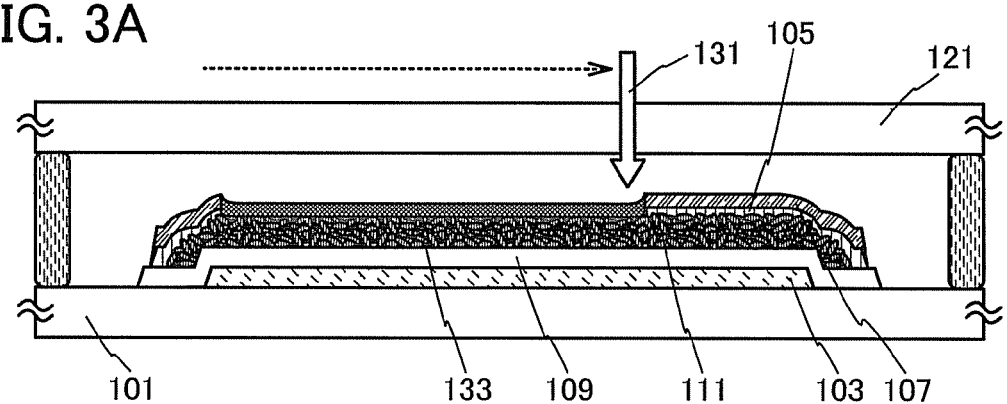
FIGS. 3A and 3B illustrate a method of manufacturing a light-emitting device according to one embodiment of the present invention.
Figure 3B:
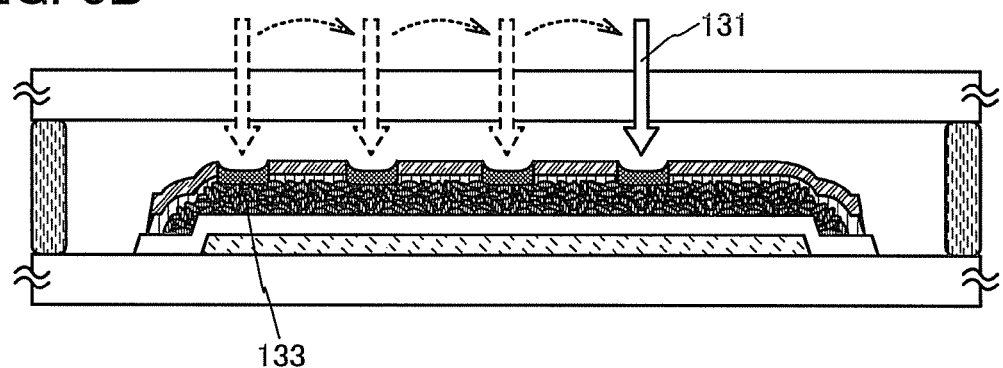

The laser light 131 can be delivered while scanning along the connection electrode layer 111. An irradiation method of the laser light 131 will be described here with reference to FIGS. 3A and 3B. FIGS. 3A and 3B are schematic cross-sectional views of the irradiation step with the laser light 131 along the connection electrode layer 111.

FIG. 3A illustrates a manner in which the laser light 131 is continuously delivered through the counter substrate 121 while scanning along the connection electrode layer 111. By irradiation with the laser light 131, the connection portion 133 where the connection electrode layer 111 is surely electrically connected to the upper electrode layer 107 is formed. By continuously delivering the laser light 131 in this manner, the area of the connection portion 133 can be increased; accordingly, the contact resistance between the connection electrode layer 111 and the upper electrode layer 107 can be remarkably reduced.

Alternatively, the laser light 131 can be intermittently delivered as in FIG. 3B. By intermittently delivering the laser light 131, the irradiation time can be shortened; accordingly, the load on a laser irradiation apparatus can be reduced even when a large substrate is used as the substrate 101, and the processing time can be shortened.

An optical property of the region irradiated with the laser light 131 over the connection electrode layer 111 is sometimes different from that of a region not irradiated with the laser light 131. For example, the EL layer 105 is partly vaporized to be thinned by the laser light 131, which causes a change in light reflectance or light transmittance. Here, by observation of such a change in optical property with an optical microscope, for example, the region irradiated with the laser light 131 can be detected. The following can be given as other examples of a factor of the change in optical property: vaporization, elimination, or thickness reduction of one or both of the upper electrode layer 107 and the EL layer 105, and property modification of one or both of them by irradiation energy of the laser light 131.

According to the method of manufacturing a light-emitting device described in this embodiment, the irradiation step with the laser light 131 can be performed after the substrate 101 and the counter, substrate 121 are bonded to each other. Therefore, even when the irradiation step with the laser light 131 is performed in an atmospheric atmosphere, impurities such as moisture and oxygen hardly enter the light-emitting element and the treatment can be easily performed. Moreover, since irradiation with the laser light 131 can be performed in the air, the structure of an irradiation apparatus of the laser light 131 can be, simplified.

Note that the connection electrode layer 111 is formed over the lower electrode layer 103 with the insulating layer 109 positioned therebetween in this embodiment; a structure may be employed as long as the connection electrode layer 111 is electrically insulated from the lower electrode layer 103. For example, an opening may be provided in the lower electrode layer 103, and the connection electrode layer 111 may be formed in the opening such that the connection electrode layer 111 does not in contact with the lower electrode layer 103.

Through the above steps, a light-emitting device 100 which includes the connection portion 133 where the upper electrode layer 107 and the connection electrode layer 111 are surely electrically connected to each other can be manufactured (see FIG. 2B). Here, the connection electrode layer 111 functions as an auxiliary electrode layer for supporting the conductivity of the upper electrode layer 107. Thus, the light-emitting device 100 manufactured by this method can be a highly reliable light-emitting device in which light-emission defects caused by voltage drop due to the resistance of the upper electrode layer 107 are reduced and luminance unevenness is suppressed.

Here, a portion with a light-emission defect in the light-emitting portion can be detected by driving the light-emitting device, and the portion with a light-emission defect can be insulated. Steps of detection and insulation of a portion with a light-emission defect in the light-emitting device 100 will be described below (see FIG. 2C).

The light-emitting device is driven, that is, voltage is applied between the upper electrode layer 107 and the lower electrode layer 103 so that the light-emitting portion emits light, whereby a defect such as a luminescent spot where emission intensity is higher than in the other region or a dark spot where light emission is not obtained can be observed. For example, in the case where the light-emitting layer is left in the region 125, in which the EL layer 105 is thinner than in the other region, a luminescent spot can be observed as a defect.

In order to detect a portion with a light-emission defect, an observation method such as observation with the human eye, an optical microscope, or an image-sensing device with which visible light or infrared light can be observed can be employed. Even when observation with the human eye is difficult, much heat might be generated in a region in which large current flows; thus, observation of infrared light generated by the heat is also effective. In particular, a potential defect which does not exhibit a distinctively different emission intensity has a relatively high current value compared to the other region and thus is easily detected by observation of infrared light.

In addition, it is preferable to measure a current value corresponding to the voltage applied to the light-emitting portion at the time of making the light-emitting portion emit light. In the case where current larger than or equal to assumed current flows, there is high possibility that somewhere in the light-emitting portion is short-circuited or includes a portion where the EL layer 105 is thin, so that the presence or absence of a defect can be easily determined. In particular, in the case where there is a potential defect as described above, it is difficult to determine the presence or absence of the defect by luminance difference in observation of visible light; thus, it is particularly effective to determine the presence or absence of a defect from the measured current value.

A portion with a light-emission defect is detected in this manner, and then the portion with a light-emission defect is irradiated with laser light to be insulated. Specifically, the upper electrode layer 107 in a region in which the defect occurs, two layers of the upper electrode layer 107 and the EL layer 105 in that region, or three layers of the upper electrode layer 107, the EL layer 105, and the lower electrode layer 103 in that region are removed by irradiation with laser light; thus, the region is insulated.

The region 125 which includes the light-emission defect detected by the above observation is selectively irradiated with laser light 135, whereby the portion with the light-emission defect is insulated.

Irradiation with the laser light 135 makes it possible to remove at least the upper electrode layer 107 in the portion with the light-emission defect. Note that depending on the wavelength or energy density of the laser light 135 used, the EL layer 105 or both the EL layer 105 and the lower electrode layer 103 are also removed at the same time as the upper electrode layer 107.

Figure 2D:
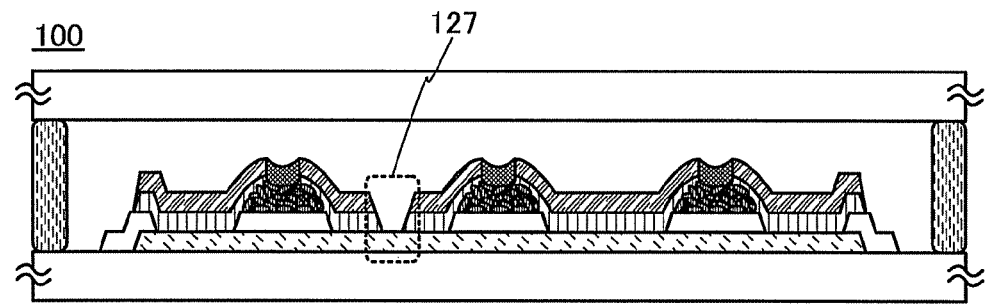

FIG. 2D is a schematic view of the light-emitting device 100 in which a portion with a light-emission defect has been insulated. In a region 127 illustrated in FIG. 2D, in which the portion with a light-emission defect has been irradiated with the laser light 135, the EL layer 105 and the upper electrode layer 107 are removed; thus, the region 127 is insulated.

As described above, the insulation step of a portion with a light-emission defect can be performed after the substrate 101 and the counter substrate 121 are bonded to each other; therefore, the insulation step can be easily performed in an atmospheric atmosphere. Moreover, since irradiation with the laser light 135 can be performed in the air, the structure of an irradiation apparatus of the laser light 135 can be simplified.

After that, a lens array for diffusion of light emission may be formed over a surface of the counter substrate 121, which does not face the substrate 101. The lens array can be formed by attaching a sheet on which a lens array is formed. The sheet is preferably formed using a material with a high refractive index. The lens array is provided on the side from which light is extracted, whereby a region in which a defective portion is insulated and which is recognized as a dark spot becomes inconspicuous by light which is emitted from the other region and diffused by the lens array.

Through the above steps, the light-emitting device 100 in which the upper electrode layer 107 and the connection electrode layer 111 are surely electrically connected to each other and light-emission defects are reduced can be manufactured (see FIG. 2D). The light-emitting device 100 manufactured by this method can be a highly reliable light-emitting device in which light-emission defects caused by voltage drop due to the resistance of the upper electrode layer 107 are reduced and luminance unevenness is suppressed. Moreover, since light-emission defects or potential defects are reduced in advance, the light-emitting device 100 can have extremely high reliability.

<Material and Formation Method>

Here, materials which can be used for the components and a method of forming the components will be described. Note that the materials are not limited to those given below, and a material having a similar function can be used as appropriate.

<<Substrate>>

As a material for the substrate provided on the side from which light is extracted, a material with a light-transmitting property, such as glass, quartz, or an organic resin, can be used. A material for the substrate provided on the side opposite to the side from which light is extracted does not necessarily have a light-transmitting property, and a material such as a metal, a semiconductor, ceramics, or a colored organic resin can be used as well as the above materials. In the case where a conductive substrate is used, the substrate preferably has an insulating property by oxidation of its surface or formation of an insulating film over the surface.

As a method by which a surface of a conductive substrate such as a metal substrate or an alloy substrate is insulated, an anodic oxidation method, an electrodeposition method, or the like can be used. In the case where an aluminum substrate is used as the substrate, for example, an anodic oxidation method is preferable because aluminum oxide formed over the surface by the method has a high insulating property and thus can be formed to be thin. In addition, an organic resin such as a polyamide-imide resin or an epoxy resin can be formed over the substrate surface by an electrodeposition method. Such an organic resin has a high insulating property and flexibility; thus, a crack hardly occurs in the surface even when the substrate is bent. In addition, when a material with high heat resistance is used, deformation of the substrate surface due to heat generated at the time of driving the light-emitting device can be suppressed.

In the case where an organic resin is used for the substrate, for example, any of the following can be used as the organic resin: polyester resins such as polyethylene terephthalate (PET) and polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide-imide resin, a polyvinylchloride resin, and the like. Further, a substrate in which a glass fiber is impregnated with an organic resin or a substrate in which an inorganic filler is mixed with an organic resin can be used.

Especially in the case of a top-emission light-emitting device, a substrate having high thermal conductivity, such as a metal substrate or an alloy substrate, is preferably used as the substrate that is provided with a light-emitting element and is on the side opposite to the side from which light is extracted. A large lighting device using a light-emitting element might have a problem of heat generation from the light-emitting element; therefore, the use of such a substrate having high thermal conductivity can enhance dissipation of the heat. For example, when a substrate of aluminum oxide, duralumin, or the like in addition to a stainless steel substrate is used, light weight and high thermal dissipation can be achieved. A stack of aluminum and aluminum oxide, a stack of duralumin and aluminum oxide, a stack of duralumin and magnesium oxide, or the like is preferably used, in which case the substrate surface can have an insulating property.

<<Light-Emitting Element>>

As a light-transmitting material which can be used for an electrode layer through which light is extracted, indium oxide, indium oxide-tin oxide, indium oxide-zinc oxide, zinc oxide, zinc oxide to which gallium is added, graphene, or the like can be used.

Alternatively, for the electrode layer, a metal material such as gold, silver, platinum, magnesium, nickel, tungsten, chromium, molybdenum, iron, cobalt, copper, palladium, or titanium, or an alloy of any of these metal materials can be used. Further alternatively, a nitride of any of the metal materials (e.g., titanium nitride) or the like may be used. In the case of using such a metal material (or a nitride thereof), the electrode layer may be thinned so as to transmit light.

Further, a stacked film of any of the above materials can be used as the electrode layer. For example, a stacked film of an alloy of silver and magnesium and indium oxide-tin oxide is preferably used because conductivity can be increased.

The thickness of the electrode layer through which light is extracted is, for example, greater than or equal to 50 nm and less than or equal to 300 nm, preferably greater than or equal to 80 nm and less than or equal to 130 nm, further preferably greater than or equal to 100 nm and less than or equal to 110 nm.

The EL layer includes at least a layer containing a light-emitting organic compound. In addition, the EL layer can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate.

Note that in one embodiment of the present invention, a light-emitting element (a tandem light-emitting element) in which a plurality of EL layers is provided between an upper electrode layer and a lower electrode layer can be used. A stacked structure of two layers, three layers, or four layers (in particular, three layers) is preferably used. In addition, an intermediate layer containing a material having a high electron-transport property, a material having a high hole-transport property, or the like may be provided between these EL layers. Structure examples of the EL layer will be described in detail in Embodiment 5.

An electrode layer which is provided on the side opposite to the side from which light is extracted is formed using a reflective material. As the reflective material, a metal material such as aluminum, gold, platinum, silver, nickel, tungsten, chromium, molybdenum, iron, cobalt, copper, or palladium can be used. Any of the following can also be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, a metal film or a metal oxide film is stacked on an aluminum alloy film, whereby oxidation of the aluminum alloy film can be prevented. As examples of a material for the metal film or the metal oxide film, titanium and titanium oxide are given. Aluminum can also be used as a material for the electrode layer; however, in that case, aluminum might be corroded when provided in direct contact with indium oxide-tin oxide or the like. Therefore, the electrode layer may have a stacked structure in which aluminum is used for a layer that is not in contact with indium oxide-tin oxide or the like.

Note that a conductive film used for the light-emitting element can be formed by a film formation method such as an evaporation method, a sputtering method, or a CVD method. In addition, the EL layer can be formed by a film formation method such as an evaporation method, an inkjet method, or the like.

<<Insulating Layer>>

As a material for an insulating layer, for example, an organic resin such as polyimide, acrylic, polyamide, or epoxy or an inorganic insulating material can be used. In addition, there is no particular limitation on the formation method. A sputtering method, an evaporation method, a droplet discharge method (such as an inkjet method), a printing method (such as screen printing or offset printing), or the like may be used.

Note that a drying agent may be contained in the insulating layer. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent.

<<Connection Electrode Layer>>

In the case of forming the connection electrode layer by a printing method such as screen printing, a conductive paste in which conductive particles having a diameter of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersible nanoparticles can be used. In addition, as the organic resin included in the conductive paste, one or more organic resins selected from those functioning as a binder of metal particles, a solvent, a dispersing agent, and a coating material can be used. Organic resins such as an epoxy resin and a silicone resin can be given as typical examples. Further, in forming the connection electrode layer, baking is preferably performed after the conductive paste is printed.

In addition, in the case where the connection electrode layer is formed in such a manner that a conductive film is formed by a film formation method such as a sputtering method or a CVD method and then is selectively etched, a conductive material for the light-emitting element can be used for the conductive film, as appropriate. Alternatively, the connection electrode layer may be formed by a plating method.

<<Sealing Material>>

A known material can be used as the sealing material. For example, a thermosetting material or an ultraviolet curable material may be used. Alternatively, an epoxy resin of a two-component-mixture type or the like can be used. A material capable of bonding inorganic materials, organic materials, or an inorganic material and an organic material is used as the sealing material in accordance with an adhesion site. Further, it is preferable that a material for the sealing material do not transmit moisture and oxygen as much as possible.

The substrate and the counter substrate may be bonded to each other as follows: an organic resin in which glass particles are dispersed or an extremely thin glass film is used as the sealing material, and the material is interposed between the substrates and then is melted by laser treatment. Further, temporary bonding by heat treatment may be performed before the laser treatment. The junction portion where bonding is performed using glass in this manner is unlikely to transmit impurities such as moisture and oxygen. Accordingly, a highly reliable light-emitting device can be achieved.

Note that a drying agent may be contained in the sealing material. For example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent.

The sealing material can be formed by a printing method such as screen printing, an inkjet method, a dispenser method, or the like.

<Laser Irradiation Mechanism>

Here, an example of a structure of an apparatus provided with an irradiation mechanism of the laser light 131 or the laser light 135 and a detection mechanism of a portion with a light-emission defect will be described with reference to FIG. 5. Here, a structure will be described with which selective irradiation with the laser light is possible and a portion with a light-emission defect can be detected by applying voltage to a light-emitting element provided over a substrate and measuring current flowing through the light-emitting element while observing light emitted from the light-emitting element with an emission microscope.

Figure 5:
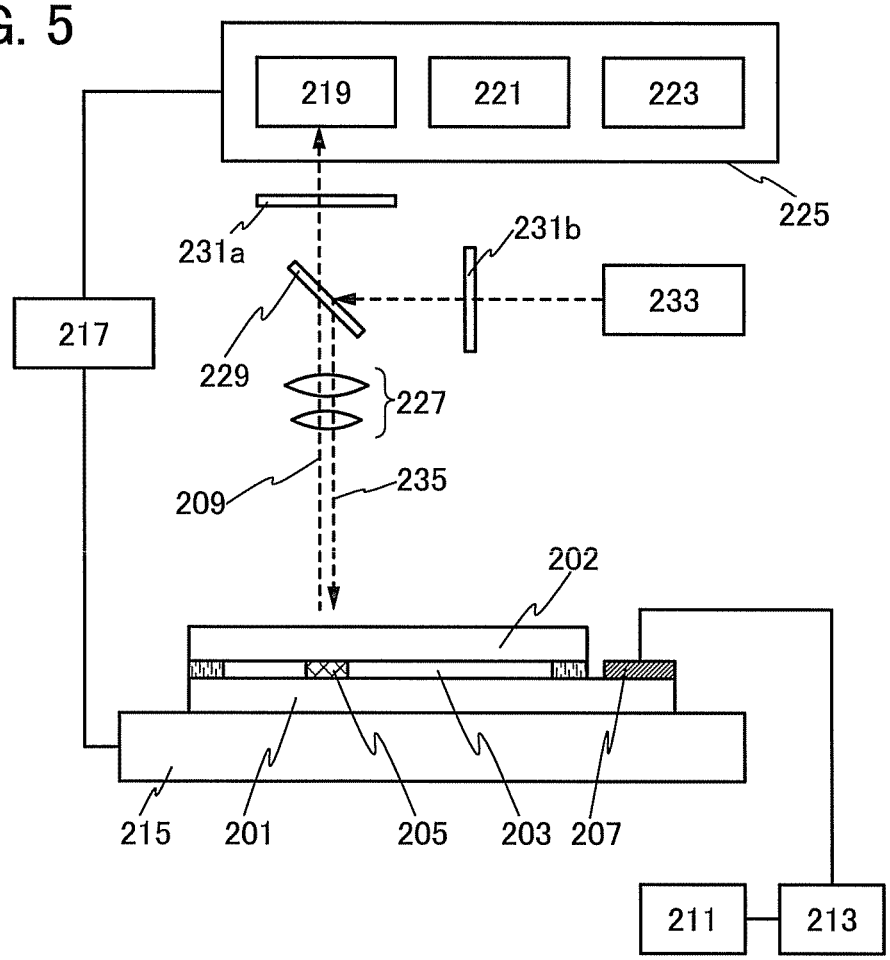
FIG. 5 illustrates an irradiation method of laser light according to one embodiment of the present invention.

For clarity, FIG. 5 schematically illustrates a substrate 201, a counter substrate 202, and a light-emitting element 203 and an electrode 207 for applying voltage to the element, which are provided over the substrate 201. Note that in an actual case, two electrodes which are electrically connected to at least an upper electrode layer and a lower electrode layer of the light-emitting element are provided as the electrode 207.

The substrate 201 provided with the light-emitting element 203 is set over a stage 215. In addition, the electrode 207 provided over the substrate 201 is electrically connected to an external power source 211 through a source meter 213. Accordingly, the light-emitting element formed over the substrate 201 can emit light by using the external power source 211. At this time, the value of current flowing through the light-emitting element 203 is measured with the source meter 213.

An emission microscope 225 includes a camera 219, an image processing mechanism 221, and a display device 223. With the use of the camera 219 included in the emission microscope 225, the distribution of photons of light emitted from the light-emitting element can be observed; the results can be output to the display device 223 via the image processing mechanism 221.

An optical microscope including a super-sensitive camera (a photon-counting camera) can be used for the camera 219. The light emission detected here is input to the image processing mechanism 221 as an image signal, subjected to image processing, and displayed on the display device 223. At this time, the image of the detected light emission is overlapped with an image of a pattern over the substrate 201 which is photographed in advance, so that a light emission portion can be detected. For example, the display device 223 displays the distribution of photons of light emitted from portions with light-emission defects in the light-emitting element 203, using color variation; thus, a portion which exhibits a color different from that of the other region can be recognized as a portion with a light-emission defect and its position can be detected.

In the case of a light-emission defect which can be detected by observation of visible light, such as a luminescent spot or a dark spot, the portion with a light-emission defect can be detected by observing the distribution of photons of light in the visible light range.

It is generally known that when leakage current is generated by a short circuit between electrodes, emission of light with a continuous spectrum in a wide range from visible light to infrared light is detected. With the super-sensitive camera (photon-counting camera) used in one embodiment of the present invention, with which observation is performed utilizing the phenomenon in which a crystal containing Si transmits infrared light having a wavelength longer than a wavelength corresponding to the band gap energy of the crystal, a portion with a light-emission defect due to a short circuit can be detected.

The emission microscope 225 is connected to a position alignment mechanism 217 for moving the stage 215 and detects the position of an irradiation target region 205 by observing the substrate 201 while moving the stage 215. In addition, the position alignment mechanism 217 moves the stage 215 so that the irradiation target region 205 can be irradiated the laser light 235, on the basis of data of the detected position of the irradiation target region 205. Here, the irradiation target region refers, for example, to a region overlapping with the connection electrode layer 111 or a region including a detected portion with a light-emission defect.

A laser device 233 can emit laser light for electrically connecting the connection electrode layer 111 to the upper electrode layer 107 and laser light for insulating a portion with a light-emission defect. In the case where laser light with different wavelengths is used for these purposes, the laser device 233 may be provided with a plurality of laser light sources and have a mechanism by which the wavelength of laser light for irradiation is switched as needed. It is preferable to provide a plurality of laser light sources because the two steps, the step of irradiating a portion over the connection electrode layer 111 with the laser light and the step of irradiating a portion with a light-emission defect, can be performed with one laser device.

As the laser light source of the laser device 233, a laser light source which outputs light with a wavelength appropriate for the intended purpose may be used. For example, one or more of the following lasers can be used: a gas laser such as an Ar laser, a Kr laser, or an excimer laser; and a solid-state laser such as a laser whose medium is single-crystal YAG, $YVO_4$, forsterite ($Mg_2SiO_4$), $YAlO_3$, or $GdVO_4$ to which one or more of Nd, Yb, Cr, Ti, Ho, Er, Tm, and Ta is added as a dopant, or a polycrystalline (ceramic) YAG $Y_2O_3$, $YVO_4$, $YAlO_3$, or $GdVO_4$ to which one or more of Nd, Yb, Cr, Ti, Ho, Er, Tm, and Ta is added as a dopant, a glass laser, a ruby laser, an alexandrite laser, a Ti:sapphire laser, or a fiber laser. Alternatively, a second harmonic, a third harmonic, or a higher harmonic emitted from the above solid-state laser can be used. Note that when a solid-state laser whose laser medium is solid is used, there are advantages in that a maintenance-free condition can be maintained for a long time and output of the laser light is relatively stable. A short time pulsed laser such as a nanosecond pulsed laser, a picosecond pulsed laser, or a femtosecond pulsed laser is appropriate for this step. With the short time pulsed laser, a high-density energy which causes a multiphoton absorption phenomenon can be applied to the irradiation target region 205.

Next, a method of detecting the position of the irradiation target region 205 and performing irradiation with the laser light 235 with the use of the above structure will be described.

When a shutter 231a is opened, a pattern of the connection electrode layer 111 over the substrate 201 and light 209 emitted from the light-emitting element 203 are detected by the camera 219 in the emission microscope 225 through a condenser lens 227, a half mirror 229, and the shutter 231a. The detection results are displayed on the display device 223 via the image processing mechanism 221. At this time, a shutter 231b is closed.

In order to detect a portion with a light-emission defect by making the light-emitting element 203 emit light, light emission may be caused by application of voltage between the upper electrode layer and the lower electrode layer of the light-emitting element 203 from the external power source 211 via the electrode 207. At this time, current flowing through the light-emitting element 203 is measured with the source meter 213.

The position of the irradiation target region 205 is detected, and then the stage 215 is moved by the position alignment mechanism 217 so that the irradiation target region 205 can be irradiated with laser light.

Then, the shutter 231a is closed, and the shutter 231b is opened so that the laser light 235 is emitted from the laser device 233. The irradiation target region 205 over the substrate 201 is irradiated with the laser light 235 through the half mirror 229 and the condenser lens 227.

In the case where the laser light 235 scans along a pattern over the substrate, irradiation with the laser light 235 may be performed while the stage 215 is moved. In that case, the scan speed may be adjusted as appropriate in accordance with the wavelength or intensity of the laser light 235.

In the above manner, the irradiation target region 205 whose position has been detected can be irradiated with the laser light 235. Thus, the connection electrode layer 111 can be surely electrically connected to the upper electrode layer 107, or a portion with a light-emission defect can be insulated.

Here, when the irradiation with the laser light 235 is performed through the counter substrate 202, the irradiation is performed so that the laser light 235 is not focused on the counter substrate 202 and a surface thereof (so that the laser light 235 is defocused). Further, in order to deliver the laser light 235 onto the connection electrode layer 111, the irradiation is performed so that the laser light 235 is focused on at least a region overlapping with the connection electrode layer 111. In order to irradiate a portion with a light-emission defect with the laser light 235, the irradiation is performed so that the laser light 235 is focused on any of the upper electrode layer 107, the EL layer 105, and the lower electrode layer 103 in the portion with a light-emission defect.

Further, after the laser light 235 is delivered onto the connection electrode layer 111, the light-emitting element 203 may be made to emit light again in order to reconfirm whether proper light emission is obtained or not. If electrical connection between the connection electrode layer 111 and the upper electrode layer 107 is insufficient, luminance unevenness of the light-emitting element is observed, in which case laser irradiation may be performed again.

Further, after the portion with a light-emission defect is irradiated with the laser light 235 to be insulated, light emission of the light-emitting element 203 may be confirmed at the same time as remeasurement of current flowing therethrough with the source meter 213. By comparing current before the irradiation and current after the irradiation, it can be found whether insulation is properly performed or not.

Note that the external power source 211 and the source meter 213 may be omitted when not used in the steps of detection and insulation of a portion with a light-emission defect, and a simple structure in which only an optical microscope is provided as the camera 219 may be employed.

Note that as a method of insulating a portion with a light-emission defect by irradiation with the laser light 235, there are a method in which a material of the upper electrode layer or the lower electrode layer is irradiated with the laser light 235 and is oxidized, so that the portion with a light-emission defect is insulated; a method in which the portion with a light-emission defect is physically separated by irradiation with the laser light 235 and thus is insulated; and the like. In one embodiment of the present invention, both the above methods for insulation can be performed by adjusting the output of the laser light 235.

Further, in order to electrically connect the connection electrode layer 111 to the upper electrode layer 107 by irradiation with the laser light 235, the beam diameter of the laser light 235 is preferably greater than or equal to 50%, further preferably greater than or equal to 60% and less than or equal to 95%, of the pattern width of the connection electrode layer 111. An increase in beam diameter leads to an increase in the area of the connection portion 133 which can be formed by one irradiation; accordingly, the contact resistance between the connection electrode layer 111 and the upper electrode layer 107 can be reduced with the time for the irradiation step shortened.

In addition, when a portion with a light-emission defect is insulated by irradiation with the laser light 235, adjustment of the output and irradiation time of the laser light 235 is needed so that an influence of the irradiation on a peripheral portion, such as damage to a normal region which does not include a light-emission defect, is as little as possible. The beam diameter of the laser light 235 in one embodiment of the present invention is preferably larger than the diameter of the portion with a light-emission defect to be irradiated with the laser light 235; specifically, a diameter of 1.0 µm to 3.0 µm is preferable. In the case where the diameter of the portion with a light-emission defect is larger than the beam diameter, irradiation with the laser light 235 is performed plural times while the stage 215 is moved.

Examples of a mechanism and a method for laser light irradiation have been described so far.

This embodiment can be combined with any of the other embodiments disclosed in this specification as appropriate.

Embodiment 2

In this embodiment, an example of a method of manufacturing a light-emitting device, which is different from that in Embodiment 1, will be described with reference to FIGS. 6A to 6D and FIG. 7. Note that the description that overlaps with that in Embodiment 1 is omitted or is simply given.

<Example of Manufacturing Method>

Figure 6A:
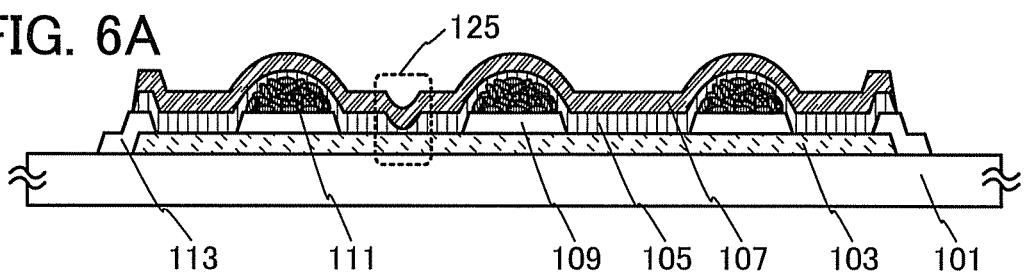
FIGS. 6A to 6D illustrate a method of manufacturing a light-emitting device according to one embodiment of the present invention.
Figure 6B:
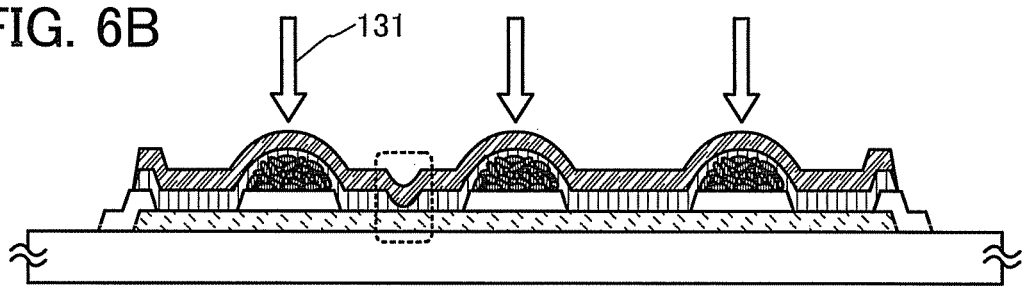

First, the lower electrode layer 103, the insulating layers 109 and 113, the connection electrode layer 111, the EL layer 105, and the upper electrode layer 107 are formed in this order over the substrate 101 as in Embodiment 1 (see FIG. 6A). Here, it is assumed that the region 125 in which the EL layer 105 is locally thin is formed.

Then, a region overlapping with the connection electrode layer 111 is irradiated with the laser light 131, so that the connection electrode layer 111 is electrically connected to the upper electrode layer 107. Irradiation with the laser light 131 may be performed by the method described in Embodiment 1.

Here, in this embodiment, a step of connecting the connection electrode layer 111 to the upper electrode layer 107 is performed before a step of bonding the substrate 101 and the counter substrate 121 to each other. Therefore, a method other than irradiation with the laser light 131 can be used as a method of connecting the connection electrode layer 111 to the upper electrode layer 107.

Figure 7:
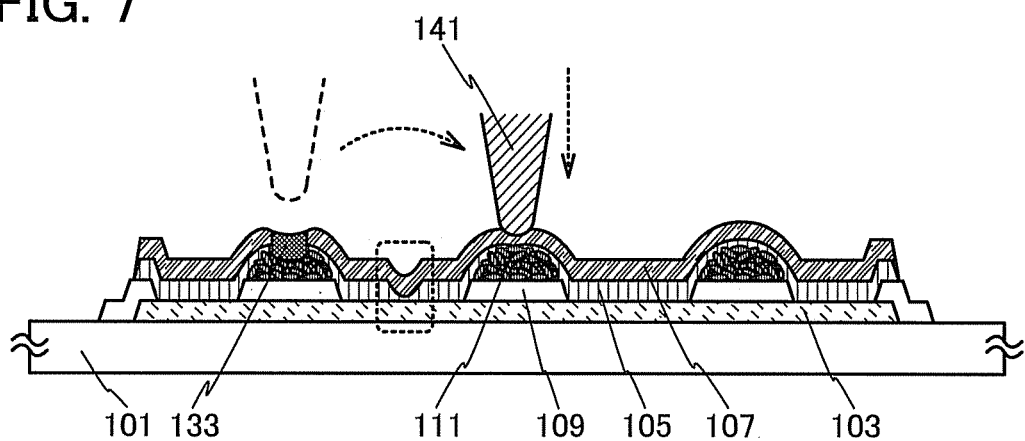
FIG. 7 illustrates a method of manufacturing a light-emitting device according to one embodiment of the present invention.

FIG. 7 illustrates an example of a connection method other than irradiation with the laser light 131. FIG. 7 illustrates a manner in which the connection electrode layer 111 and the upper electrode layer 107 are electrically connected to each other by being pressure-bonded with application of ultrasonic vibration and heat.

A probe 141 has a heatable tip portion with a curvature. Further, the probe 141 can apply ultrasonic vibration.

The heated tip of the probe 141 is made to be in contact with the upper electrode layer 107 in the region overlapping with the connection electrode layer 111 and pressure is applied downward, whereby the upper electrode layer 107 and the connection electrode layer 111 are pressure-bonded to be electrically connected to each other. In addition, application of ultrasonic vibration further facilitates effective bonding.

By performing pressure bonding with the use of the probe 141 in this manner, the connection portion 133 where the connection electrode layer 111 is surely electrically connected to the upper electrode layer 107 is formed.

Pressure bonding may be performed while the probe 141 scans along the connection electrode layer 111, or pressure bonding may be intermittently performed on a plurality of regions overlapping with the connection electrode layer 111. Alternatively, a plurality of probes 141 may be used to perform pressure bonding on the plurality of regions at the same time.

Note that pressure bonding is performed with application of ultrasonic vibration and heat in the above description; pressure bonding may be performed with application of only ultrasonic vibration, only heat, or only pressure.

Further, a knife-shaped structure may be used instead of the probe 141, and pressure bonding may be performed linearly along the connection electrode layer 111. The knife shape makes it possible to increase the area which can be processed in one treatment and to shorten the processing time.

Figure 6C:
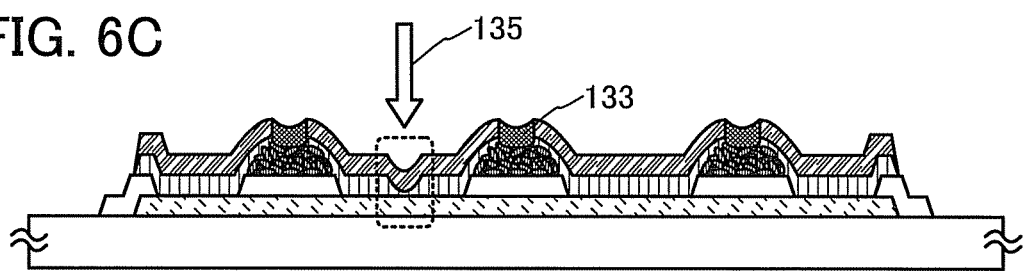

Next, the following steps may be added: voltage is applied between the upper electrode layer and the lower electrode layer of the light-emitting element, a portion with a light-emission defect is detected, and then the portion with a light-emission defect is insulated (see FIG. 6C). These steps can be performed by the method described in Embodiment 1.

Note that the step of electrically connecting the connection electrode layer 111 to the upper electrode layer 107 and the steps of detecting and insulating a portion with a light-emission defect are preferably performed after the upper electrode layer 107 is formed, under reduced pressure or in an inert gas atmosphere without exposure to the air.

Then, the substrate 101 and the counter substrate 121 are bonded to each other. In this embodiment, a structure in which a sealant is provided between the substrate 101 and the counter substrate 121 is described.

First, a sealant 143 and the sealing material 123 are each formed over the substrate 101 or the counter substrate 121.

As the sealant 143, an inorganic material, an organic material, or a combination thereof which has a light-transmitting property with respect to light emitted from the light-emitting element, or a stack of any of these materials can be used as appropriate. Further, it is preferable that the refractive index of the sealant 143 with respective to the light emission be adjusted. In addition, it is preferable that a material for the sealant 143 be unlikely to transmit moisture and oxygen as in the case of the sealing material. The same material may be used for the sealant 143 and the sealing material 123.

Further, the sealant can be formed by a film formation method such as a sputtering method or a CVD method, or can be formed by a printing method or a coating method as in the case of the sealing material.

The substrate 101 and the counter substrate 121 are bonded to each other, and then are subjected to vacuum-pressure-bonding while being heated under reduced pressure. In this step, the sealant 143 and the sealing material 123 are thermally cured; thus, the substrate 101 and the counter substrate 121 are bonded to each other.

Here, in the case where a portion with a light-emission defect has been insulated, the insulated portion can be filled with the sealant 143. Consequently, a problem in which the upper electrode layer 107 and the lower electrode layer 103 are in contact with each other again to be short-circuited in the insulated portion can be prevented. Further, the sealant 143 is provided in contact with part of the EL layer 105 which is exposed in the insulated portion, whereby entry of an impurity through the insulated portion can be suppressed. Accordingly, a highly reliable light-emitting device can be provided.

Figure 6D:
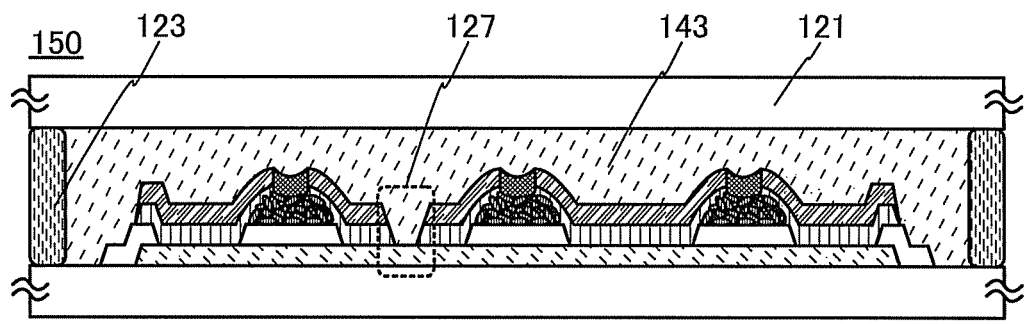

Through the above steps, a light-emitting device 150 can be manufactured (see FIG. 6D). In the light-emitting device 150 manufactured by the above manufacturing method, the conductively of the upper electrode layer 107 is supported and light-emission defects are reduced in advance; thus, the light-emitting device 150 can have high reliability.

After that, a lens array for diffusion of light emission may be formed over a surface of the counter substrate 121, which does not face the substrate 101. The lens array is provided on the side from which light is extracted, whereby a region in which a defective portion is insulated and which is recognized as a dark spot becomes inconspicuous by light which is emitted from the other region and diffused by the lens array.

This embodiment can be combined with any of the other embodiments disclosed in this specification as appropriate.

Embodiment 3

In this embodiment, application examples of the connection electrode layer described in the above embodiments will be described with reference to FIGS. 8A and 8B.

<Structure Example 1>

Figure 8A:
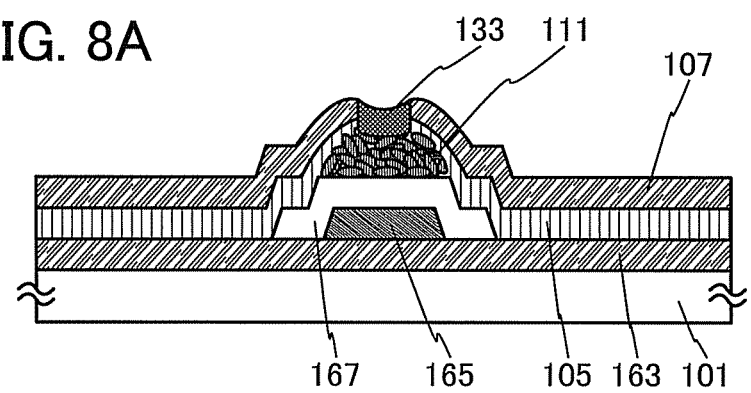
FIGS. 8A and 8B each illustrate a light-emitting device according to one embodiment of the present invention.

FIG. 8A illustrates an example in which the connection electrode layer 111 is used in a dual-emission light-emitting device.

The light-emitting device illustrated in FIG. 8A includes, over the substrate 101, a lower electrode layer 163, an auxiliary electrode layer 165, an insulating layer 167, the connection electrode layer 111 having the connection portion 133, the EL layer 105, and the upper electrode layer 107.

Here, the lower electrode layer 163 has a light-transmitting property with respect to light emitted from the EL layer 105 as in the case of the upper electrode layer 107. Therefore, light emitted from the EL layer 105 is extracted from both the substrate 101 side and the surface side of the substrate 101.

Further, the auxiliary electrode layer 165 is provided in contact with the lower electrode layer 163 and has a function of supporting the conductivity of the lower electrode layer 163. The auxiliary electrode layer 165 can be formed using a material similar to that for the connection electrode layer 111. Note that the auxiliary electrode layer 165 does not necessarily have a surface with an uneven shape.

The insulating layer 167 is formed over the auxiliary electrode layer 165 so as to electrically insulate the auxiliary electrode layer 165 from the connection electrode layer 111 and the upper electrode layer 107. Further, end portions of the insulating layer 167 are preferably tapered in order to prevent division of the EL layer 105 and the upper electrode layer 107 formed thereover. The insulating layer 167 can be formed using a material and a method similar to those of the insulating layers described in the above embodiments.

The connection electrode layer 111 is formed over the auxiliary electrode layer 165 with the insulating layer 167 positioned therebetween. In addition, part of the connection electrode layer 111 is provided with the connection portion 133 electrically connected to the upper electrode layer 107; thus, the connection electrode layer 111 is surely electrically connected to the upper electrode layer 107.

Note that the auxiliary electrode layer 165 and the connection electrode layer 111 are formed to overlap with each other in this structure example, but may be provided not to overlap with each other. By forming the auxiliary electrode layer 165 and the connection electrode layer 111 to overlap with each other, the area of a non-light-emitting region can be reduced.

With such a structure, the conductivity of the upper electrode layer 107 can be supported by the connection electrode layer 111, and the conductivity of the lower electrode layer 163 can be supported by the auxiliary electrode layer 165. Accordingly, a dual-emission light-emitting device in which luminance unevenness due to the resistance of the electrode layers is suppressed can be achieved.

<Structure Example 2>

Figure 8B:
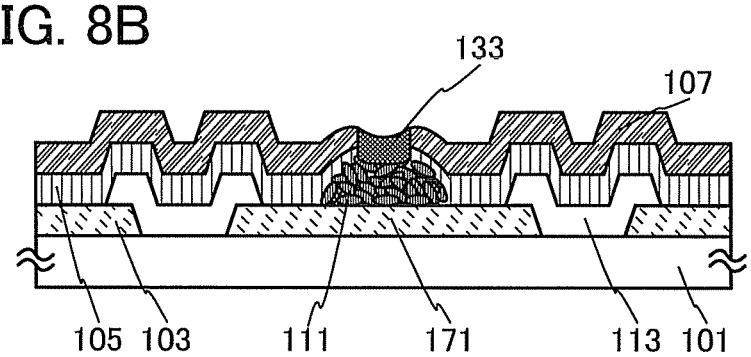

FIG. 8B illustrates an example in which the connection electrode layer 111 is used for electrically connecting a wiring 171 provided over a substrate to the upper electrode layer 107.

The wiring 171 which is formed using the same film as the lower electrode layer 103 is provided over the substrate 101. Further, the connection electrode layer 111 having the connection portion 133 is formed over and in contact with the wiring 171.

By forming the connection electrode layer 111 in contact with the wiring 171, the wiring 171 can be surely electrically connected to the upper electrode layer 107 which is formed over the wiring 171 with the EL layer 105 positioned therebetween. The wiring 171 can be used as a connection wiring for connecting an external power source to the upper electrode layer 107, for example.

Note that the wiring 171 is formed using the same film as the lower electrode layer 103 in this structure example, but may be formed using a conductive film whose material or thickness is different from that of the lower electrode layer 103. In that case, it is preferable to use a material having lower resistivity than a material for the lower electrode layer 103 or to adjust the thickness so that the wiring 171 can have lower resistance than the lower electrode layer 103.

This embodiment can be combined with any of the other embodiments disclosed in this specification as appropriate.

Embodiment 4

In this embodiment, specific structure examples of a light-emitting device to which the connection electrode layer is applied will be described with reference to FIGS. 9A and 9B, FIGS. 10A and 10B, and FIGS. 11A and 11B.

<Structure Example 1>

Figure 9A:
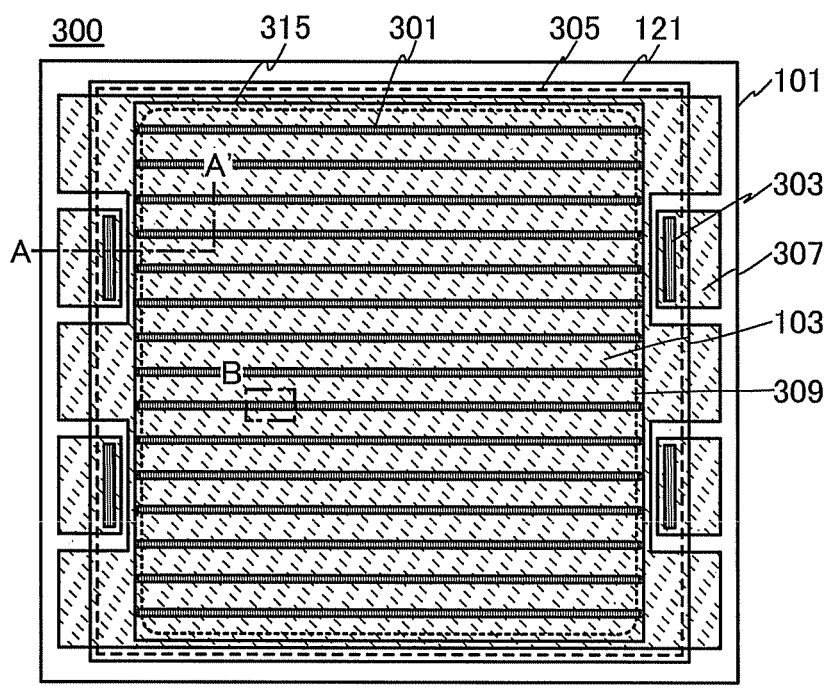
FIGS. 9A and 9B illustrate a light-emitting device according to one embodiment of the present invention.
Figure 9B:
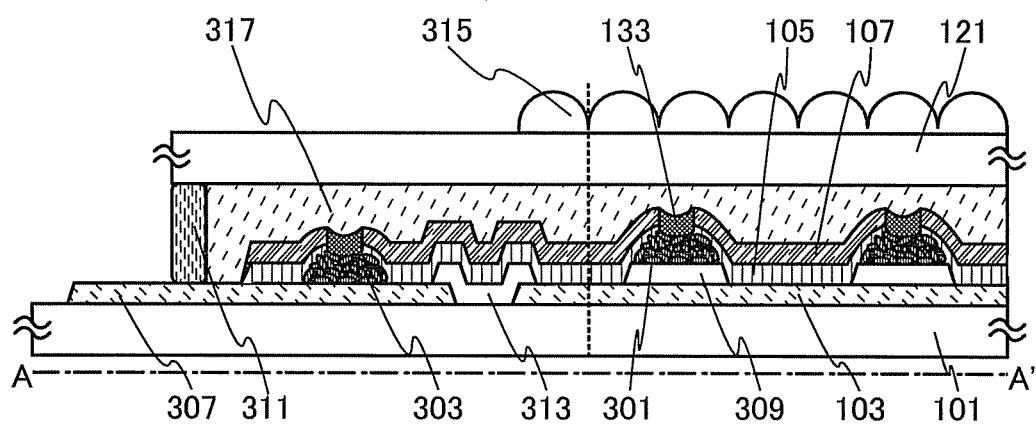

FIG. 9A is a schematic top view of a light-emitting device 300 described in this embodiment. FIG. 9B is a schematic cross-sectional view illustrating a cross section taken along line A-A' in FIG. 9A.

In the top-emission light-emitting device 300, the lower electrode layer 103, the EL layer 105, the upper electrode layer 107, a connection electrode layer 301, a connection electrode layer 303, a wiring 307, an insulating layer 309, and an insulating layer 313 are provided over the substrate 101, and the substrate 101 and the counter substrate 121 are bonded to each other with a sealing material 311 provided on an outer peripheral portion of the substrate 101 or the counter substrate 121. A region surrounded by a dotted line in FIG. 9A is a film formation region 305 in which the EL layer 105 and the upper electrode layer 107 are formed. Here, a region which is over the substrate 101 and overlaps with the counter substrate 121 is referred to as a sealed region. In addition, the sealed region of the light-emitting device 300 is filled with a sealant 317. Further, a lens array 315 is provided over a surface of the counter substrate 121, which does not face the substrate 101, so as to overlap with a light-emitting region.

In the sealed region of the light-emitting device 300, a light-emitting element in which the lower electrode layer 103, the EL layer 105, and the upper electrode layer 107 are stacked in this order is formed. The light-emitting element emits light by application of voltage between the lower electrode layer 103 and the upper electrode layer 107.

Part of the lower electrode layer 103 extends beyond the sealed region. Part of the wiring 307 formed using the same film as the lower electrode layer 103 also extends beyond the sealed region. Further, the insulating layer 313 is provided to cover an end portion of the lower electrode layer 103 and an end portion of the wiring 307 at least in the sealed region.

The lens array 315 is provided in order to diffuse light emitted from the light-emitting element. Thus, the lens array 315 has an effect of making a region inconspicuous, such as a region formed by insulating a portion with a light-emission defect by laser irradiation or a non-light-emitting region due to the connection electrode layer 303 functioning as an auxiliary electrode layer, or the like.

Moreover, in order to suppress total reflection of light emitted from the light-emitting element and to extract light emission efficiently, it is preferable to select materials for the upper electrode layer 107, the sealant 317, the counter substrate 121, and the lens array 315 so that the film or member has a higher refraction index with distance from the EL layer 105. Further, an interface of each film or member may have an uneven shape for suppression of total reflection so that total reflection at the interface can be suppressed.

In the sealed region, the connection electrode layer 303 having the connection portion 133 is provided in contact with a top surface of the wiring 307 and is electrically connected to the upper electrode layer 107.

Thus, the light-emitting element can emit light by application of voltage between the lower electrode layer 103 and the wiring 307. Here, a power supply line through which power is supplied from an external power source can be electrically connected to each of the lower electrode layer 103 and the wiring 307. In the case where a power source for home use is used as the external power source, for example, an AC-DC converter may be provided between the external power source and the light-emitting device 300 and direct-current power for driving the light-emitting device 300 may be supplied to the light-emitting device 300. In addition, the AC-DC converter is preferably provided over the substrate 101.

Further, the connection electrode layer 301 having the connection portion 133 is formed over the lower electrode layer 103 with the insulating layer 309 positioned between the connection electrode layer 301 and the lower electrode layer 103. The connection electrode layer 301 functions as an auxiliary electrode layer for supporting the conductivity of the upper electrode layer 107.

Figure 10A:
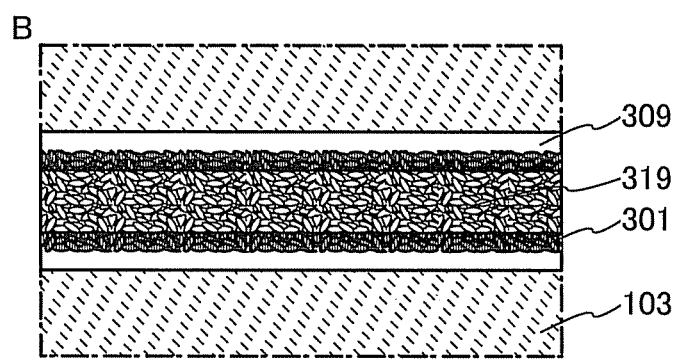
FIGS. 10A and 10B each illustrate a light-emitting device according to one embodiment of the present invention.
Figure 10B:
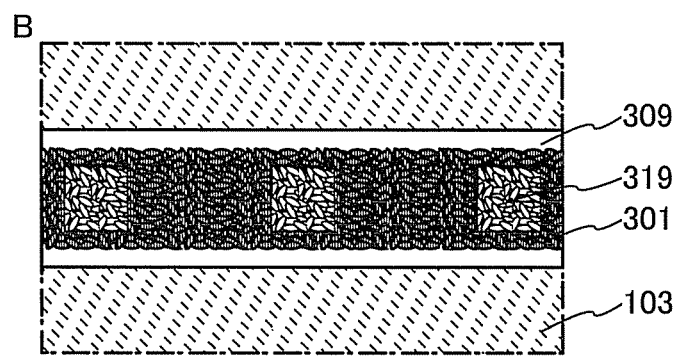

Here, examples of an observation image in the case where a region B in FIG. 9A, which includes the connection electrode layer 301, is observed from the counter substrate 121 side with an optical microscope are shown in FIGS. 10A and 10B. Note that the case where the lens array 315 is not provided is described here for clarity. FIG. 10A is an example of an observation image in the case where laser light is continuously delivered along the connection electrode layer 301, and FIG. 10B is an example of an observation image in the case where laser light is intermittently delivered onto the connection electrode layer 301. In both cases, the upper electrode layer 107 and the EL layer 105 in the top-emission light-emitting device 300 have light-transmitting properties, and thus the lower electrode layer 103, the insulating layer 309, and the connection electrode layer 301 can be observed through the upper electrode layer 107 and the EL layer 105. A change in optical property is caused in a laser irradiation region 319 over the connection electrode layer 301 as described above, and thus the laser irradiation region 319 is recognized as a region with a different color when observed with the optical microscope.

By providing the connection electrode layer 301 and the connection electrode layer 303, the EL layer 105 and the upper electrode layer 107 can be formed in the same region so as to overlap with the connection electrode layer 301 and the connection electrode layer 303. Therefore, the light-emitting device 300 can be manufactured without use of a metal mask for forming a plurality of island-shaped patterns. Accordingly, problems due to a metal mask are prevented, and thus the light-emitting device 300 can have high reliability.

Moreover, a light-emission defect due to the resistance of the upper electrode layer 107 is repaired by provision of the connection electrode layer 301 functioning as an auxiliary electrode layer, and the light-emitting device 300 can be favorably increased in size and have high reliability.

<Structure Example 2>

Figure 11A:
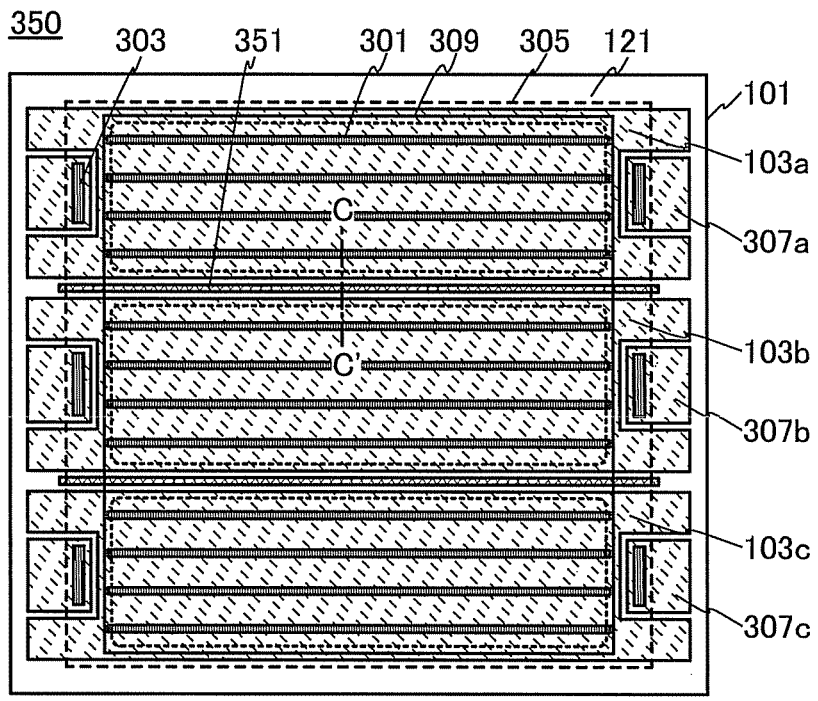
FIGS. 11A and 11B illustrate a light-emitting device according to one embodiment of the present invention.
Figure 11B:
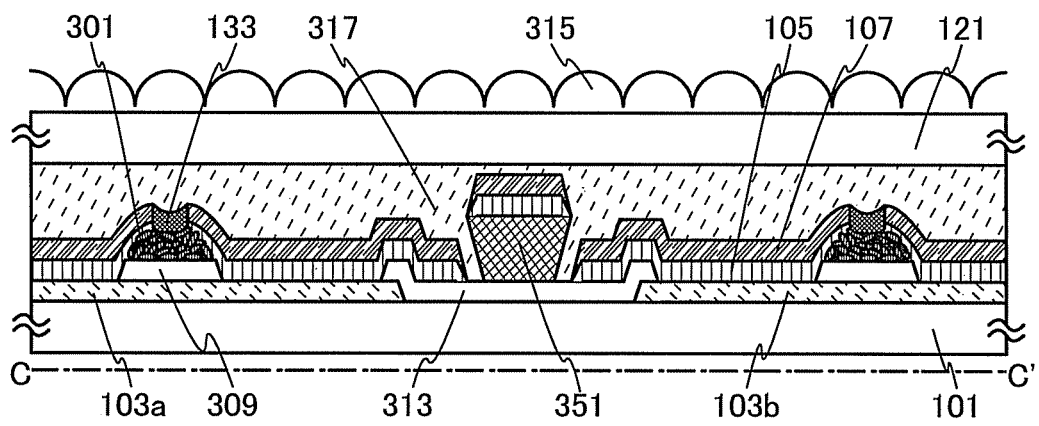

A light-emitting device 350 described in this structure example is a light-emitting device in which a plurality of light-emitting elements is provided over the substrate 101. FIG. 11A is a schematic top view of the light-emitting device 350 described in this structure example. FIG. 11B is a schematic cross-sectional view illustrating a cross section taken along line C-C' in FIG. 11A.

The light-emitting device 350 includes three light-emitting elements. In the light-emitting device 350, a lower electrode layer 103a, a lower electrode layer 103b, a lower electrode layer 103c, the EL layer 105, the upper electrode layer 107, a wiring 307a, a wiring 307b, a wiring 307c, the connection electrode layer 301, the connection electrode layer 303, a separation layer 351, the insulating layer 309, and the insulating layer 313 are provided over the substrate 101, and the substrate 101 and the counter substrate 121 are bonded to each other with a sealing material (not illustrated) provided on an outer peripheral portion of the substrate 101 or the counter substrate 121. A region surrounded by a dotted line in FIG. 11A is the film formation region 305 in which the EL layer 105 and the upper electrode layer 107 are formed. Here, a region which is over the substrate 101 and overlaps with the counter substrate 121 is referred to as a sealed region. In addition, the sealed region of the light-emitting device 350 is filled with the sealant 317. Further, the lens array 315 is provided over a surface of the counter substrate 121, which does not face the substrate 101, so as to overlap with a light-emitting region.

The light-emitting device 350 includes three light-emitting elements: a first light-emitting element including the lower electrode layer 103a, a second light-emitting element including the lower electrode layer 103b, and a third light-emitting element including the lower electrode layer 103c. Part of the lower electrode layer 103a, part of the lower electrode layer 103b, and part of the lower electrode layer 103c extend beyond the sealed region. Further, the connection electrode layer 303 having the connection portion 133 is connected to each of the wiring 307a, the wiring 307b, and the wiring 307c in the sealed region so as to be in contact with top surfaces thereof. Part of the wiring 307a, part of the wiring 307b, and part of the wiring 307c extend beyond the sealed region. Thus, each of the light-emitting elements emits light by application of voltage between the lower electrode layer and the wiring connected to the light-emitting element.

The separation layer 351 which electrically divides the EL layer 105 and the upper electrode layer 107 is provided between the lower electrode layer 103a and the lower electrode layer 103b and between the lower electrode layer 103b and the lower electrode layer 103c, and extends beyond the film formation region 305.

The separation layer 351 has an insulating property and is provided to physically divide the EL layer 105 and the upper electrode layer 107, which are formed thereover, so that the separation layer 351 serves as a boundary. The separation layer 351 can have a shape at least one side surface of which protrudes in parallel to the substrate 101, like a T-shape or an inverted tapered shape. When a film is formed over the separation layer 351 having such a shape, the film is not formed in a region covered with the protruding region of the side surface. Accordingly, the film can be formed to be physically divided by the separation layer 351 serving as a boundary. In this manner, the upper electrode layer 107 is electrically divided by the separation layer 351 serving as a boundary.

The separation layer 351 can be formed, for example, using a negative photosensitive organic resin by light exposure and development treatment. At this time, light-exposure conditions are adjusted so that the exposure amount is smaller in a region closer to the substrate 101; thus, the separation layer 351 having an inverted tapered shape can be formed. Alternatively, the separation layer 351 having a T-shape may be formed as follows: a light-exposure area and light-exposure conditions are adjusted and light exposure is performed more than once. Further alternatively, the T-shaped separation layer 351 may be formed in such a manner that films formed using a plurality of materials are stacked and are each processed by a photolithography method. The T-shaped separation layer 351 may be formed in one photolithography step, for example, in such a manner that etching is performed so that a side surface of a film in a lower layer is recessed by utilizing a difference in etching rate.

By providing the separation layer 351 having such a structure between the light-emitting elements, the light-emitting elements can be electrically separated from each other by the separation layer 351 serving as a boundary.

As described above, the lower electrode layers through which power can be independently supplied to respective ones of the first light-emitting element, the second light-emitting element, and the third light-emitting element are provided to extend beyond the sealed region; similarly, the wirings through which power can be independently supplied to respective ones of the light-emitting elements are provided to extend beyond the sealed region. Depending on the electrical connection of the lower electrode layers and the wirings of the light-emitting elements, the light-emitting elements can be connected to one another in series, in parallel, or in a series-parallel combination. In addition, as in the above description, an AC-DC converter may be provided between an external power source and the light-emitting device 350, and the AC-DC converter is preferably provided over the substrate 101.

Further, the connection electrode layer 301 having the connection portion 133 is formed over a top surface of each of the lower electrode layer 103a, the lower electrode layer 103b, and the lower electrode layer 103c with the insulating layer 309 positioned between the connection electrode layer 301 and the top surface. The connection electrode layer 301 functions as an auxiliary electrode layer for supporting the conductivity of the upper electrode layer 107.

Note that the number of light-emitting elements in the light-emitting device 350 is three in this structure example, but is not limited thereto; the light-emitting device may include two or more light-emitting elements. In addition, these light-emitting elements are not necessarily arranged in line, and the plurality of light-emitting elements may be arranged at high density.

Note that an optical adjustment layer may be provided between the lower electrode layer 103 and the upper electrode layer 107 in a light-emitting portion where the lower electrode layer 103, the EL layer 105, and the upper electrode layer 107 are stacked. The optical adjustment layer is a layer for adjusting the optical distance between a reflective electrode and a light-transmitting electrode. With the optical adjustment layer, light with a wavelength in a specific range can be enhanced and thus color rendering properties of emitted light can be improved. Further, a plurality of optical adjustment layers having different thicknesses may be provided in one light-emitting portion. In the case where the light-emitting device includes a plurality of light-emitting elements, optical adjustment layers having different thicknesses may be provided in the respective light-emitting elements and the light-emitting elements may be individually driven. In a light-emitting device having such a structure, stepwise adjustment of brightness or color tone can be performed.

By providing the separating layer 351, the connection electrode layer 301, and the connection electrode layer 303, the EL layer 105 and the upper electrode layer 107 can be formed in the same region so as to overlap with the separating layer 351, the connection electrode layer 301, and the connection electrode layer 303. Therefore, the light-emitting device 350 including the plurality of light-emitting elements can be manufactured without use of a metal mask for forming a plurality of island-shaped patterns. Accordingly, problems due to a metal mask are prevented, and thus the light-emitting device 350 can have high reliability.

Moreover, a light-emission defect due to the resistance of the upper electrode layer 107 is repaired by provision of the connection electrode layer 301 functioning as an auxiliary electrode layer, and the light-emitting device 350 can be favorably increased in size and have high reliability.

Note that the plurality of connection electrode layers functioning as auxiliary electrode layers for the upper electrode layer is arranged in parallel in this embodiment, but the method of arranging the connection electrode layers is not limited thereto. The connection electrode layers may be arranged to form a lattice pattern, or island-shaped connection electrode layers may be provided in regions in which they are needed.

This embodiment can be combined with any of the other embodiments disclosed in this specification as appropriate.

Embodiment 5

In this embodiment, examples of an EL layer that can be applied to one embodiment of the present invention will be described with reference to FIGS. 12A to 12C.

Figure 12A:
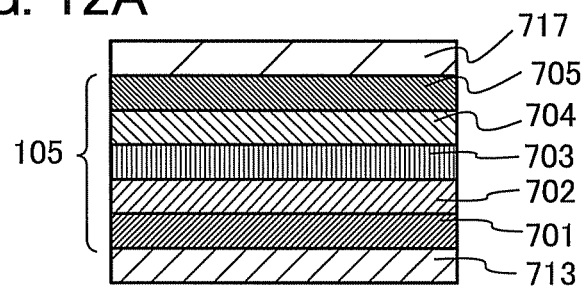
FIGS. 12A to 12C each illustrate an EL layer according to one embodiment of the present invention.

As illustrated in FIG. 12A, the EL layer 105 is provided between a first electrode 713 and a second electrode 717. The first electrode 713 and the second electrode 717 can have structures similar to those of the lower electrode layer and the upper electrode layer which are described in the above embodiments.

A light-emitting element including the EL layer 105 described in this embodiment can be used in any of the light-emitting devices described in the above embodiments.

The EL layer 105 includes at least a light-emitting layer containing a light-emitting organic compound. In addition, the EL layer 105 can have a stacked structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 105, a hole-injection layer 701, a hole-transport layer 702, a layer 703 containing a light-emitting organic compound, an electron-transport layer 704, and an electron-injection layer 705 are stacked in this order from the first electrode 713 side. Note that the stacking order may be inversed.

A method of manufacturing the light-emitting element illustrated in FIG. 12A will be described.

The hole-injection layer 701 is a layer containing a substance having a high hole-injection property. As the substance having a high hole-injection property, for example, a metal oxide such as molybdenum oxide, titanium oxide; vanadium oxide, rhenium oxide, ruthenium oxide, chromium oxide, zirconium oxide, hafnium oxide, tantalum oxide, silver oxide, tungsten oxide, or manganese oxide can be used. A phthalocyanine-based compound such as phthalocyanine (abbreviation: H$_2$Pc) or copper(II) phthalocyanine. (abbreviation: CuPc) can also be used.

In addition, an aromatic amine compound, which is a low molecular organic compound, or the like can be used.

Further, any of high molecular compounds (such as oligomers, dendrimers, or polymers) can be used A high molecular compound to which acid is added can be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, excellent hole injection from the first electrode 713 can be obtained, which results in a reduction in the driving voltage of the light-emitting element. Such a composite material can be formed by co-evaporation of a substance having a high hole-transport property and an acceptor substance. The hole-injection layer 701 is formed using the composite material, whereby hole injection from the first electrode 713 to the EL layer 105 is facilitated.

As the organic compound for the composite material, any of a variety of compounds such as an aromatic amine compound, a carbazole derivative, aromatic hydrocarbon, and a high molecular compound (such as oligomer, dendrimer, or polymer) can be used. The organic compound for the composite material is preferably an organic compound having a high hole-transport property. Specifically, a substance having a hole mobility of $10^{-6}$ cm$^2$/Vs or higher is preferably used. Note that other than the above substances, any substance that has a property of transporting more holes than electrons may be used.

Examples of an electron acceptor include transition metal oxides. In addition, oxides of metals belonging to Groups 4 to 8 in the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable because it is stable in the air, has a low hygroscopic property, and is easily handled.

The hole-transport layer 702 is a layer containing a substance having a high hole-transport property. As the substance having a high hole-transport property, for example, an aromatic amine compound can be used. The substance is mainly one that has a hole mobility of $10^{-6}$ cm$^2$/Vs or higher. Note that other than the above substance, any substance that has a property of transporting more holes than electrons may be used. The layer containing a substance having a high hole-transport property is not limited to a single layer, and two or more layers containing the above substance may be stacked.

In addition, a carbazole derivative, an anthracene derivative, or a high molecular compound having a high hole-transport property may be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which a light-emitting organic compound (a guest material) is dispersed in another substance (a host material). As the host material, various kinds of materials can be used, and it is preferable to use a substance which has a lowest unoccupied molecular orbital level (LUMO level) higher than that of a light-emitting substance and has a highest occupied molecular orbital level (HOMO level) lower than that of the light-emitting substance.

As the host material, plural kinds of materials can be used. For example, in order to suppress crystallization, a substance which suppresses crystallization may be further added. In addition, a different kind of substance may be further added in order to efficiently transfer energy to the guest material.

When a structure in which a guest material is dispersed in a host material is employed, crystallization of the layer 703 containing a light-emitting organic compound can be suppressed. Further, concentration quenching due to high concentration of the guest material can be suppressed.

For the layer 703 containing a light-emitting organic compound, a high molecular compound can be used.

By providing a plurality of layers each containing a light-emitting organic compound and making the emission colors of the layers different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made to be complementary, so that the light-emitting element as a whole can emit white light. Note that "complementary colors" refer to colors that can produce an achromatic color when mixed. In other words, by mixing light obtained from substances which emit light of complementary colors, white light emission can be obtained. This can be applied to a light-emitting element including three or more layers each containing a light-emitting organic compound.

The electron-transport layer 704 is a layer containing a substance having a high electron-transport property. The substance having a high electron-transport property is mainly one that has an electron mobility of $10^{-6}$ cm$^2$/Vs or higher. Further, the electron-transport layer is not limited to a single layer, and two or more layers containing the above substance may be stacked.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. In addition, a rare earth metal compound such as erbium fluoride can be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (including a vacuum evaporation method), an inkjet method, or a coating method.

Figure 12B:
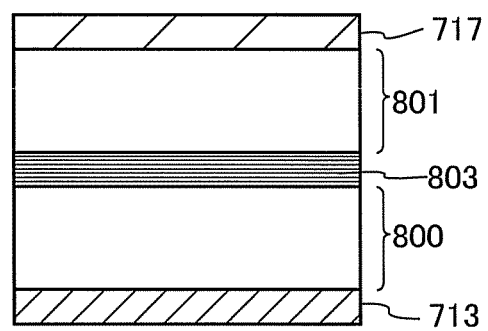

As illustrated in FIG. 12B, a plurality of EL layers may be stacked between the first electrode 713 and the second electrode 717. In that case, a charge generation layer 803 is preferably provided between a first EL layer 800 and a second EL layer 801 which are stacked. The charge generation layer 803 can be formed using the above composite material. Further, the charge generation layer 803 may have a stacked structure including a layer containing the composite material and a layer containing another material. In that case, as the layer containing another material, a layer containing an electron donating substance and a substance having a high electron-transport property, a layer formed using a transparent conductive film, or the like can be used. As for a light-emitting element having such a structure, problems such as energy transfer and quenching are unlikely to occur, and thus a light-emitting element which has both high emission efficiency and long lifetime can be easily obtained owing to expansion in the choice of materials. Moreover, a light-emitting element which provides phosphorescence from one of the EL layers and fluorescence from the other of the EL layers can be easily obtained. This structure can be combined with the above structure of the EL layer.

Further, by forming the EL layers to emit light of different colors from each other, the light-emitting element as a whole can provide light emission of a desired color. For example, in a light-emitting element including two EL layers, the emission color of the first EL layer and the emission color of the second EL layer are made to be complementary, so that the light-emitting element as a whole can emit white light. This can be applied to a light-emitting element including three or more EL layers.

In order to obtain white light with favorable color rendering properties, light whose emission spectrum covers the whole visible light range is needed and thus a light-emitting element in which three or more EL layers are stacked is preferably used. For example, such a light-emitting element can be formed by stacking EL layers emitting light of the respective colors of red, blue, and green. In this manner, the color rendering properties of a light-emitting element can be improved by stacking EL layers of different three or more colors.

An optical adjustment layer may be formed between the first electrode 713 and the second electrode 717. The optical adjustment layer is a layer for adjusting the optical distance between a reflective electrode and a light-transmitting electrode. With the optical adjustment layer, light with a wavelength in a specific range can be enhanced and thus the color tone can be adjusted.

Figure 12C:
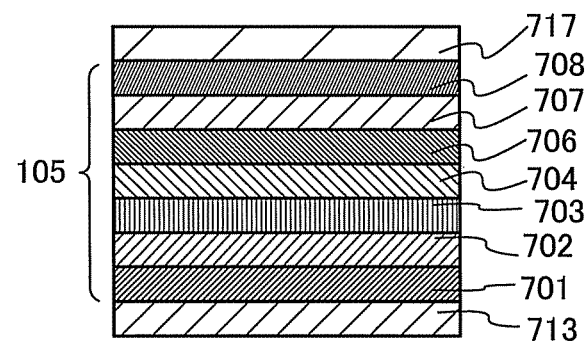

As illustrated in FIG. 12C, the EL layer 105 may include, between the first electrode 713 and the second electrode 717, the hole-injection layer 701, the hole-transport layer 702, the layer 703 containing a light-emitting organic compound, the electron-transport layer 704, an electron-injection buffer layer 706, an electron-relay layer 707, and a composite material layer 708 which is in contact with the second electrode 717.

It is preferable to provide the composite material layer 708 which is in contact with the second electrode 717, in which case damage caused to the EL layer 105 particularly when the second electrode 717 is formed by a sputtering method can be reduced. The composite material layer 708 can be formed using the above composite material in which an acceptor substance is mixed with an organic compound having a high hole-transport property.

Further, by providing the electron-injection buffer layer 706, an injection barrier between the composite material layer 708 and the electron-transport layer 704 can be lowered; thus, electrons generated in the composite material layer 708 can be easily injected into the electron-transport layer 704.

A substance having a high electron-injection property can be used for the electron-injection buffer layer 706: for example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)).

Further, in the case where the electron-injection buffer layer 706 contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is interposed between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Accordingly, an increase in driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, further preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered to be stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. In particular, a material in which a metal-oxygen double bond is likely to act on another molecule in terms of a molecular structure and which has a high acceptor property is preferably used.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent. For that reason, such a phthalocyanine derivative has an advantage of being easily handled during formation of a light-emitting element. Owing to the solubility in a solvent, such a phthalocyanine derivative also has an advantage of facilitating maintenance of an apparatus used for film formation.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be easily transferred and the light-emitting element can be driven at lower voltage.

In the case where a donor substance is contained in the electron-relay layer 707, other than the materials described above as examples of the substance having a high electron-transport property, a substance having a LUMO level higher than the acceptor level of the acceptor substance contained in the composite material layer 708 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its high stability.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may each be faulted using any of the above materials.

In the above manner, the EL layer 105 in this embodiment can be formed.

This embodiment can be combined with any of the other embodiments disclosed in this specification as appropriate.

Embodiment 6

In this embodiment, examples of a lighting device using a light-emitting device according to one embodiment of the present invention will be described with reference to FIGS. 13A and 13B.

According to one embodiment of the present invention, a lighting device whose light-emitting portion has a curved surface can be achieved.

The light-emitting device according to one embodiment of the present invention can be used for lighting in a car; for example, lighting can be provided for a dashboard or a ceiling.

Figure 13A:
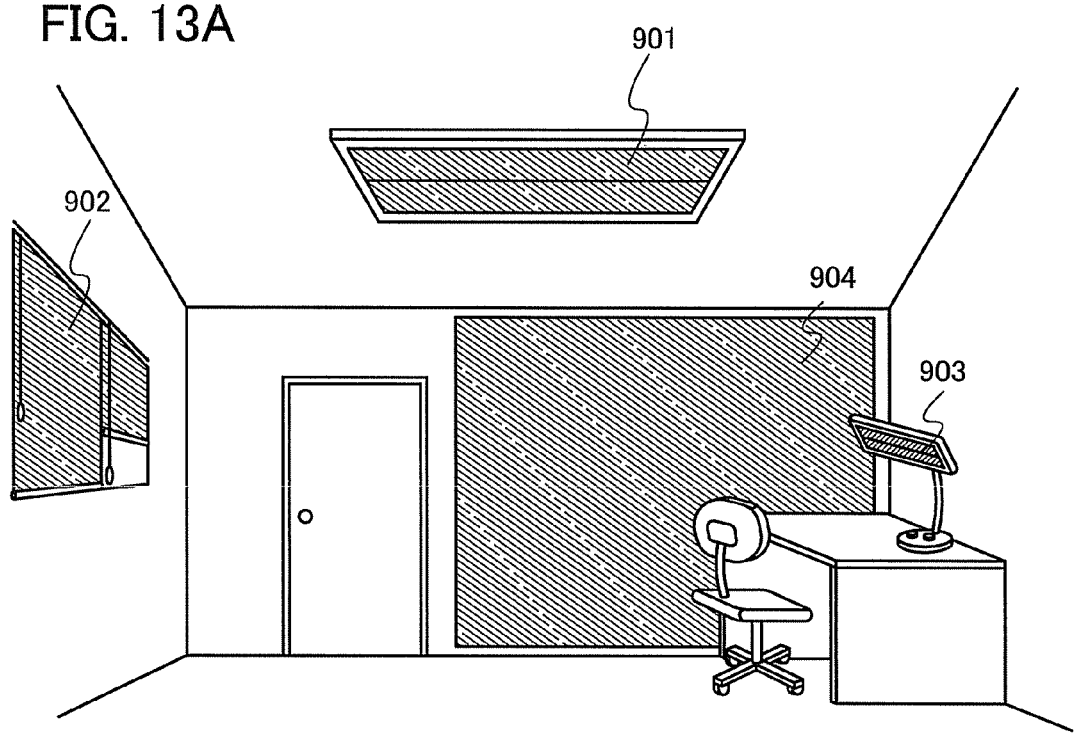
FIGS. 13A and 13B illustrate lighting devices according to one embodiment of the present invention.

FIG. 13A illustrates an interior lighting device 901, a desk lamp 903, and a planar lighting device 904 to which the light-emitting device according to one embodiment of the present invention is applied. Since the light-emitting device can have a larger area, it can be used as a large-area lighting device. Further, since the light-emitting device is thin, it can be mounted on a wall. Furthermore, the light-emitting device can be used as a roll-type lighting device 902.

Figure 13B:
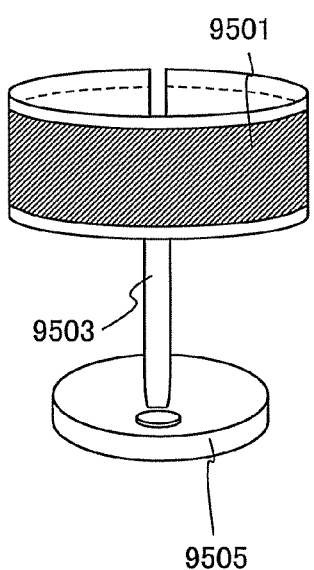

FIG. 13B illustrates another example of a lighting device. A desk lamp illustrated in FIG. 13B includes a lighting portion 9501, a support 9503, a support base 9505, and the like. The lighting portion 9501 includes the light-emitting device according to one embodiment of the present invention. As described above, according to one embodiment of the present invention, a lighting device having a curved surface or a lighting device having a flexible lighting portion can be achieved. Such use of a flexible light-emitting device for a lighting device not only improves the degree of freedom in design of the lighting device but also enables the lighting device to be mounted on a portion having a curved surface, such as a ceiling or, a dashboard of a car.

This embodiment can be combined with any of the other embodiments disclosed in this specification as appropriate.

Example

In this example, a light-emitting device fabricated by a manufacturing method according to one embodiment of the present invention will be described with reference to FIGS. 14A and 14B.

The light-emitting device described in this example has a top-emission structure. A light-emitting element included in the light-emitting device exhibits green light emission. First, a method of fabricating the light-emitting device in this example will be described.

A 50-nm-thick titanium film, a 200-nm-thick aluminum film, and a 100-nm-thick titanium film were stacked in this order by a sputtering method over a glass substrate having a size of 300 mm×360 mm; thus, a lower electrode layer was formed. In this example, the lower electrode layer was used as an anode. Note that in this example, the lower electrode layer was divided into four pieces and the divided lower electrode layers were arranged in the longitudinal direction of the substrate; thus, four light-emitting elements were formed over the glass substrate.

Next, an epoxy resin (S-30F B206 manufactured by TAIYO INK MFG CO., LTD.) was printed in stripes each having a line width of 400 μm over the lower electrode layer by a screen printing method, and then baking was performed at 140° C. for 55 minutes in an atmospheric atmosphere. Further, printing and baking of an epoxy resin were performed by a similar method under similar conditions. Thus, an insulating layer was formed. Note that the epoxy resin was printed and baked twice for thickening the insulating layer and ensuring insulation between the lower electrode layer and a connection electrode layer formed later. The insulating layer was formed in 35 stripes per light-emitting region.

Next, a conductive paste containing silver particles (AGEP-201X manufactured by Sumitomo Electric Industries, Ltd.) was printed on the insulating layer by a screen printing method so as to have a line width of approximately 200 μm and a thickness of approximately 18 μm in the central portion, and then baking was performed at 200° C. for 80 minutes in an atmospheric atmosphere. Thus, the connection electrode layer was formed.

After that, an EL layer including a layer containing a light-emitting organic compound which exhibits green light emission was formed to a thickness of approximately 157 nm by a vacuum evaporation method. An indium oxide-tin oxide film was further formed over the EL layer to a thickness of approximately 110 nm by a sputtering method, so that an upper electrode layer was formed. Thus, light-emitting elements were formed over the glass substrate. Note that the EL layer and the upper electrode layer were formed using one blocking mask for providing a non-film formation region between the four light-emitting elements and over electrodes connected to an external power source.

Then, with the use of a glass substrate having a size of 300 mm×360 mm as a counter substrate, the glass substrate over which the light-emitting elements were formed and the counter substrate were bonded to each other with a thermo-setting epoxy resin provided over an outer peripheral portion of the glass substrate; thus, the light-emitting elements were sealed. After that, a peripheral portion of the counter substrate was cut off so that the counter substrate could have a size of approximately 254 mm×314 mm.

Figure 14A:
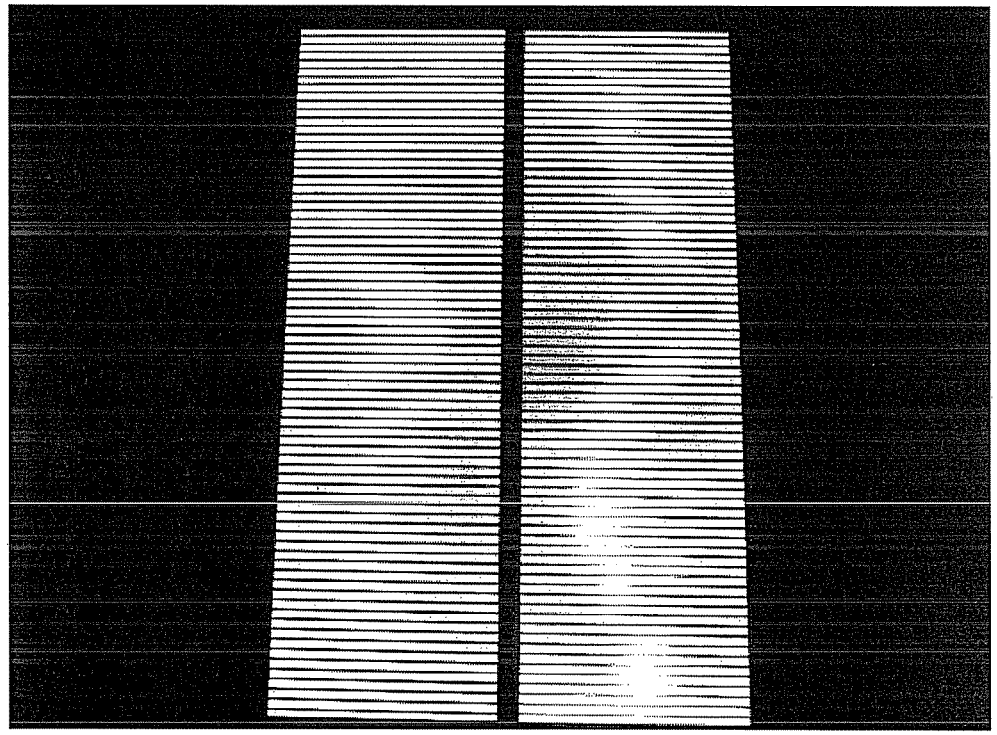
FIGS. 14A and 14B are each a photograph of a light-emitting device according to Example.

FIG. 14A is a photograph of the light-emitting device fabricated in the above manner, which is in the state of emitting light. Note that two of the four light-emitting elements were set to emit light, here. As shown in FIG. 14A, light emission on the entire light-emitting region is confirmed in each of the light-emitting elements.

Next, a region in which the connection electrode layer and the upper electrode layer overlapped with each other was irradiated with laser light through the counter substrate. Specifically, the laser light irradiation was performed under the following conditions: the wavelength was 266 mm, the output power was 3.0 W, the beam width was 15 μm, the scan speed was 100 mm/s, and the Q-switching frequency was 29 kHz.

Figure 14B:
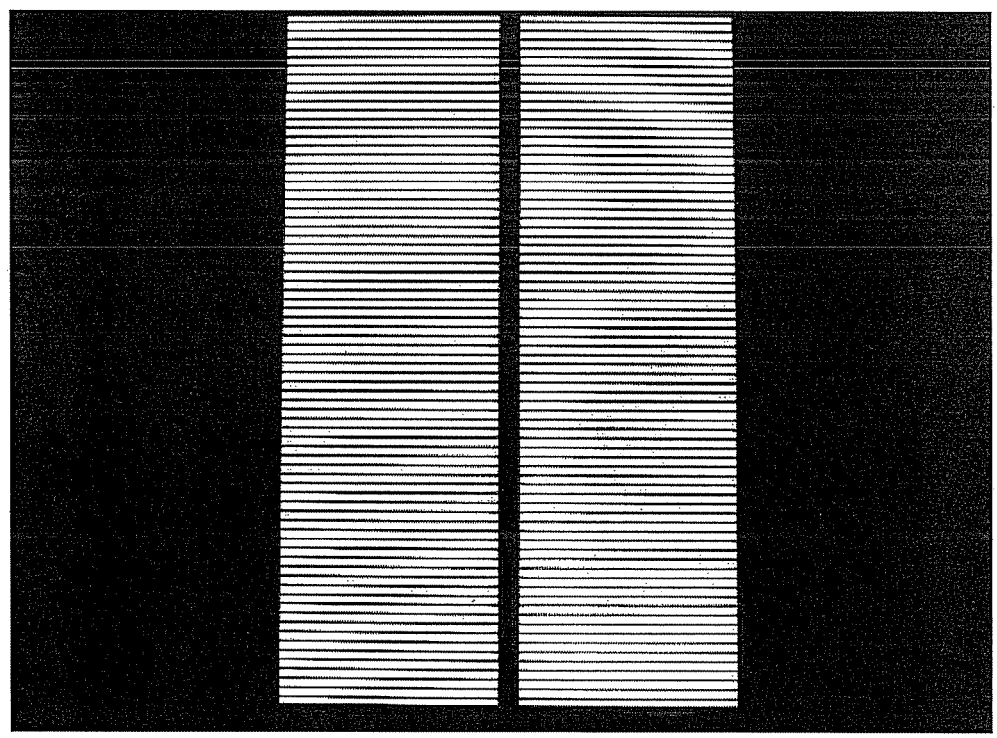

FIG. 14B is a photograph of the light-emitting device which is in the state of emitting light after the laser light irradiation. Note that the light-emitting elements in FIG. 14B are the same as the light-emitting elements in FIG. 14A. Light emission on the entire light-emitting regions of the two light-emitting elements can be confirmed also in FIG. 14B. In addition, in FIG. 14B, luminance unevenness is significantly reduced as compared to that in FIG. 14A, and uniform light emission is obtained throughout the light-emitting regions.

As described above, a connection electrode layer is surely electrically connected to an upper electrode layer by irradiating a region in which the connection electrode layer and the upper electrode layer overlap with each other with laser light, whereby a highly reliable light-emitting device in which light-emission defects caused by voltage drop due to the resistance of the upper electrode layer are reduced and luminance unevenness is suppressed can be manufactured.

EXPLANATION OF REFERENCE

100: light-emitting device, 101: substrate, 103: lower electrode layer, 105: EL layer, 107: upper electrode layer, 109: insulating layer, 111: connection electrode layer, 113: insulating layer, 121: counter substrate, 123: sealing material, 125: region, 127: region, 131: laser light, 132: laser irradiation region, 133: connection portion, 134: connection portion, 135: laser light, 141: probe, 143: sealant, 150: light-emitting device, 163: lower electrode layer, 165: auxiliary electrode layer, 167: insulating layer, 171: wiring, 201: substrate, 202: counter substrate, 203: light-emitting element, 205: irradiation target region, 207: electrode, 209: light, 211: external power source, 213: source meter, 215: stage, 217: position alignment mechanism, 219: camera, 221: image processing mechanism, 223: display device, 225: emission microscope, 227: condenser lens, 229: half mirror, 231a: shutter, 231b: shutter, 233: laser device, 235: laser light, 300: light-emitting device, 301: connection electrode layer, 303: connection electrode layer, 305: film formation region, 307: wiring, 309: insulating layer, 311: sealing material, 313: insulating layer, 315: lens array, 317: sealant, 319: laser irradiation region, 350: light-emitting device, 351: separation layer, 701: hole-injection layer, 702: hole-transport layer, 703: layer containing light-emitting organic compound, 704: electron-transport layer, 705: electron-injection layer, 706: electron-injection buffer layer, 707: electron-relay layer, 708: composite material layer, 713: first electrode, 717: second electrode, 800: first EL layer, 801: second EL layer, 803: charge generation layer, 901: lighting device, 902: lighting device, 903: desk lamp, 904: planar lighting device, 9501: lighting portion, 9503: support, and 9505: support base.

This application is based on Japanese Patent Application serial no. 2011-119296 filed with the Japan Patent Office on May 27, 2011, the entire contents of which are hereby incorporated by reference.

The invention claimed is:

1. A method of manufacturing a light-emitting device comprising:

forming a connection electrode layer on an insulating surface by a printing method, the connection electrode layer comprising a plurality of conductive particles forming a plurality of discrete islands, wherein the plurality of conductive particles form a plurality of peaks and valleys and have an uneven upper surface;

forming a layer containing a light-emitting organic compound over the connection electrode layer;

forming an electrode layer over the layer containing the light-emitting organic compound; and providing a region in which the electrode layer and the connection electrode layer overlap each other and are electrically connected to each other, wherein the plurality of conductive particles are metal particles.

2. The method of manufacturing a light-emitting device according to claim 1, wherein the region is provided with ultrasonic vibration and heat.

3. The method of manufacturing a light-emitting device according to claim 2, wherein a probe provides the region with the ultrasonic vibration and the heat.

4. The method of manufacturing a light-emitting device according to claim 1, wherein the region comprises a material of the connection electrode layer and the electrode layer.

5. A method of manufacturing a light-emitting device comprising:

forming a first electrode layer on an insulating surface;

forming a connection electrode layer on the insulating surface by a printing method so as to be electrically insulated from the first electrode layer, the connection electrode layer comprising a plurality of conductive particles forming a plurality of discrete islands, wherein the plurality of conductive particles form a plurality of peaks and valleys and have an uneven upper surface;

forming a layer containing a light-emitting organic compound over the first electrode layer and the connection electrode layer;

forming a second electrode layer over the layer containing the light-emitting organic compound; and providing a region in which the second electrode layer and the connection electrode layer overlap each other and are electrically connected to each other, wherein the plurality of conductive particles are metal particles.

6. The method of manufacturing a light-emitting device according to claim 5, further comprising: after the connection electrode layer is electrically connected to the second electrode layer, applying voltage between the first electrode layer and the second electrode layer to detect a portion with a light-emission defect; and irradiating the portion with the light-emission defect with laser light to insulate the portion with the light-emission defect.

7. The method of manufacturing a light-emitting device according to claim 5, wherein the region is provided with ultrasonic vibration and heat.

8. The method of manufacturing a light-emitting device according to claim 7, wherein a probe provides the region with the ultrasonic vibration and the heat.

9. The method of manufacturing a light-emitting device according to claim 5, wherein the region comprises a material of the connection electrode layer and the second electrode layer.

10. The method of manufacturing a light-emitting device according to claim 5, wherein the connection electrode layer and the first electrode layer overlap each other.

11. A light-emitting device comprising:

a first substrate;

a first electrode layer and a connection electrode layer over the first substrate, the connection electrode layer comprising a plurality of conductive particles forming a plurality of discrete islands, wherein the plurality of conductive particles form a plurality of peaks and valleys and have an uneven upper surface;

a layer containing a light-emitting organic compound over the first electrode layer and the connection electrode layer;

a second electrode layer over the layer containing the light-emitting organic compound; and a second substrate over the second electrode layer, wherein the plurality of conductive particles are metal particles, and wherein the connection electrode layer is electrically connected to the second electrode layer through a region that is over the connection electrode layer.

12. The light-emitting device according to claim 11, wherein the second electrode layer has a light-transmitting property with respect to light emitted from the layer containing the light-emitting organic compound.

13. The light-emitting device according to claim 11, wherein at least one of the first electrode layer and the second electrode layer has a light-transmitting property with respect to light emitted from the layer containing the light-emitting organic compound.

14. The light-emitting device according to claim 11, further comprising:

a lens array over the second substrate, wherein the region is irradiated with laser light.

15. The light-emitting device according to claim 11, wherein the region comprises a material of the connection electrode layer and the second electrode layer.

16. The light-emitting device according to claim 11, wherein the connection electrode layer and the first electrode layer overlap each other.

17. The light-emitting device according to claim 11, further comprising:

a separation layer having an insulating property, wherein a first light-emitting element comprises the first electrode layer, the connection electrode layer, the layer, and the second electrode layer, wherein a second light-emitting element comprises:

a third electrode layer and a second connection electrode layer over the first substrate, the second connection electrode layer comprising a plurality of conductive particles, wherein the plurality of conductive particles form a plurality of peaks and valleys;

a second layer containing a light-emitting organic compound over the third electrode layer and the second connection electrode layer; and a fourth electrode layer over the second layer containing the light-emitting organic compound, wherein the second connection electrode layer is electrically connected to the fourth electrode layer through a region that is over the second connection electrode layer, and wherein the second electrode layer and the layer of the first light-emitting element is insulated from the fourth electrode layer and the second layer of the second light-emitting element by using the separation layer.

* * * * *